(12) United States Patent
Hayashi

(10) Patent No.: US 10,998,472 B2
(45) Date of Patent: May 4, 2021

(54) LIGHT EMITTING DEVICE AND METHOD OF MANUFACTURING SAME

(71) Applicant: NICHIA CORPORATION, Anan (JP)

(72) Inventor: Hirosuke Hayashi, Naruto (JP)

(73) Assignee: NICHIA CORPORATION, Anan (JP)

( * ) Notice: Subject to any disclaimer, the term of this patent is extended or adjusted under 35 U.S.C. 154(b) by 178 days.

(21) Appl. No.: 16/229,968

(22) Filed: Dec. 21, 2018

(65) Prior Publication Data

US 2019/0198729 A1 Jun. 27, 2019

(30) Foreign Application Priority Data

Dec. 25, 2017 (JP) .............................. JP2017-248302

(51) Int. Cl.

| | |
|---|---|
| *H01L 33/00* | (2010.01) |
| *H01L 33/50* | (2010.01) |
| *H01L 33/60* | (2010.01) |
| *H01L 33/54* | (2010.01) |
| *H01L 33/48* | (2010.01) |
| *H01L 33/62* | (2010.01) |

(Continued)

(52) U.S. Cl.
CPC .......... *H01L 33/505* (2013.01); *H01L 33/486* (2013.01); *H01L 33/54* (2013.01); *H01L 33/60* (2013.01); *H01L 33/32* (2013.01); *H01L 33/502* (2013.01); *H01L 33/56* (2013.01); *H01L 33/62* (2013.01); *H01L 2933/005* (2013.01); *H01L 2933/0041* (2013.01); *H01L 2933/0058* (2013.01)

(58) Field of Classification Search
CPC ......... H01L 33/54; H01L 33/56; H01L 33/60; H01L 33/505; H01L 33/486
See application file for complete search history.

(56) References Cited

U.S. PATENT DOCUMENTS

2015/0340574 A1* 11/2015 Tamaki ................. H01L 33/507
257/98
2016/0095184 A1 3/2016 Nakabayashi et al.
(Continued)

FOREIGN PATENT DOCUMENTS

| JP | 2010-157638 A | 7/2010 |
|---|---|---|
| JP | 2013-012545 A | 1/2013 |

(Continued)

*Primary Examiner* — Brook Kebede
(74) *Attorney, Agent, or Firm* — Birch, Stewart, Kolasch & Birch, LLP

(57) ABSTRACT

A light emitting device includes: a light emitting element having an emission face and lateral faces; a wavelength conversion member having a first face and a second face which opposes the first face, the wavelength conversion member being disposed on the emission face of the light emitting element so that the first face faces the emission face; a reflecting member disposed on lateral face sides of the light emitting element and covering at least a portion of outer lateral faces of the wavelength conversion member, and a cover member disposed on an upper face of the reflecting member while being adjacent to peripheral ends of the wavelength conversion member. The cover member contains at least one of a reflecting substance and a coloring substance. A body color of the wavelength conversion member and a body color of the cover member are the same color or similar colors.

15 Claims, 14 Drawing Sheets

(51) Int. Cl.
  *H01L 33/32* (2010.01)
  *H01L 33/56* (2010.01)

(56) References Cited

U.S. PATENT DOCUMENTS

2016/0133809 A1* 5/2016 Kuramoto ............. H01L 21/565
                                                     438/27
2016/0348876 A1* 12/2016 Azuma ................... H01L 33/60

FOREIGN PATENT DOCUMENTS

JP    2014-072213 A    4/2014
JP    2016-072435 A    5/2016

* cited by examiner

LIGHT EMITTING DEVICE AND METHOD OF MANUFACTURING SAME

CROSS-REFERENCE TO RELATED APPLICATION

This application claims priority to Japanese Patent Application No. 2017-248302, filed on Dec. 25, 2017, the disclosure of which is hereby incorporated by reference in its entirety.

BACKGROUND

The present disclosure relates to a light emitting device and a method of manufacturing the same.

Japanese Unexamined Patent Application Publication No. 2013-12545, for example, discloses a light emitting device in which a phosphor sheet is bonded on a light emitting element and the periphery of the phosphor sheet and the light emitting element are covered by a light reflecting white member. The upper face of such a light emitting device is made up of two colors: the color of the phosphor contained in the phosphor sheet (e.g., yellow) and the color of the white member (i.e., white).

SUMMARY

In the case of using a conventional light emitting device as the light source of a lighting device such as a flashlight of a camera in a smartphone, for example, the color of the phosphor and the color of the white member appear on the lens when not emitting light. For this reason, in the case of a conventional light emitting device, depending on the design of the smartphone or its cover, for example, the external appearance might not be desirable because the entire upper face of the light emitting device does not have the color of the wavelength conversion member when not emitting light.

Accordingly, certain embodiments of the present disclosure can provide a light emitting device having high contrast between the emission region and the non-emission region when emitting light, with the entire upper face of the light emitting device being the color of the wavelength conversion member when not emitting light, and a method of manufacturing the light emitting device.

The light emitting device related to one embodiment of the present disclosure includes: a light emitting element having an emission face and lateral faces; a wavelength conversion member having a first face and a second face which opposes the first face, the wavelength conversion member being disposed on the emission face of the light emitting element so that the first face faces the emission face; a reflecting member disposed on lateral face sides of the light emitting element and covering at least a portion of outer lateral faces of the wavelength conversion member, and a cover member disposed on an upper face of the reflecting member while being adjacent to peripheral ends of the wavelength conversion member. The cover member contains at least one of a reflecting substance and a coloring substance. A body color of the wavelength conversion member and a body color of the cover member are the same color or similar colors.

The method of manufacturing a light emitting device related to one embodiment of the present disclosure includes: providing a sheet-shaped member, which has a stack of a first reflecting member and a cover member containing at least one of a pigment and dye, and a wavelength conversion member disposed in a through hole of the stack; disposing a light emitting element so that an emission face of the light emitting element faces a first face of the wavelength conversion member the wavelength conversion member being surrounded by a first reflecting member, and supplying a second reflecting member to cover lateral face sides of the light emitting element.

The method of manufacturing a light emitting device related to another embodiment of the present disclosure includes:

providing a light emitting structure which includes a light emitting element, a wavelength conversion member disposed on an emission face of the light emitting element, and a reflecting member disposed on lateral faces of the light emitting element and on lateral faces of the wavelength conversion member, and disposing a cover member, which contains at least one of a pigment and dye, on the reflecting member at the peripheral ends of the wavelength conversion member.

The light emitting device related to an embodiment of the present disclosure can increase the contrast between the emission region and the non-emission region when emitting light, and make the entire upper face of the light emitting device the same as or similar to the color of the wavelength conversion member when not emitting light.

The method of manufacturing a light emitting device related to an embodiment of the present disclosure can produce a light emitting device that can increase the contrast between the emission region and the non-emission region when emitting light, and make the entire upper face of the light emitting device the color of the wavelength conversion member when not emitting light.

DESCRIPTION

Embodiments

Figure 1A:
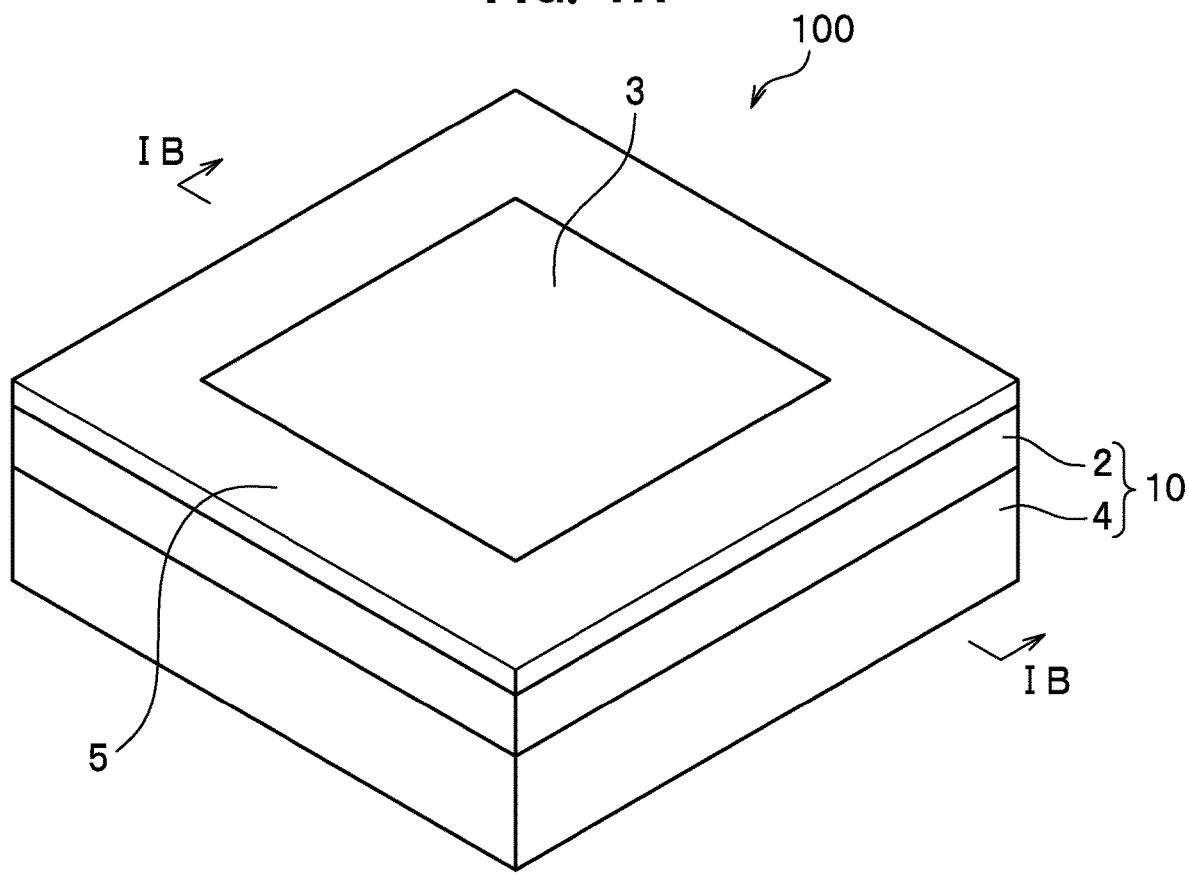
FIG. 1A is a perspective view schematically showing a structure of a light emitting device related to a first embodiment.

Certain embodiments will be explained below with reference to the accompanying drawings. The embodiments described below, however, exemplify light emitting devices and methods of manufacturing light emitting devices for the purpose of embodying the technical concepts of the invention, and are not intended to limit the invention. The dimensions, materials, and shapes of the constituent elements, as well as the relative positioning thereof described in connection with the embodiments are offered merely as examples, and are not intended to limit the scope of the invention to those described unless otherwise specifically noted. The sizes of the components, their positional relationship, and the like, shown in the drawings might be exaggerated for clarity of explanations.

First Embodiment

Light Emitting Device

First, a light emitting device related to one embodiment will be explained.

Figure 1B:
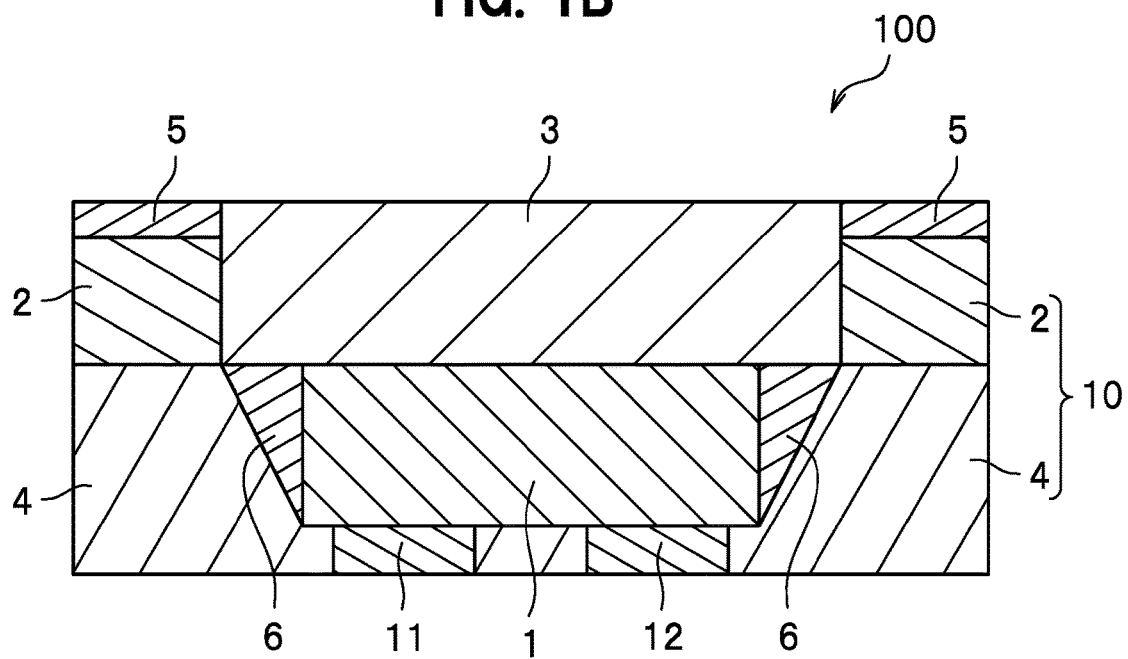
FIG. 1B is a cross-sectional view taken along line IB-IB in FIG. 1A.

As shown in FIG. 1A and FIG. 1B, a light emitting device 100 includes a light emitting element 1, a reflecting member 10, a wavelength conversion member 3, and a cover member 5. The light emitting device 100 further includes a light guide member 6 disposed on the lateral faces of the light emitting element 1.

The upper face of the light emitting device 100 is made up of an emission region and a non-emission region. An emission region refers to the region of the upper face of the light emitting device 100 that emits light (e.g., the wavelength conversion member 3) when it is caused to emit light. A non-emission region is the region excluding the emission region (e.g., the cover member 5).

Light Emitting Element

For the light emitting element 1, a semiconductor light emitting element such as an LED can be used. The light emitting element 1 can be one having a pair of positive and negative electrodes 11 and 12 formed on an element structure composed of various semiconductors. For the light emitting element 1, one structured with a nitride semiconductor ($In_xAl_yGa_{1-x-y}N$, $0 \le x$, $0 \le y$, $x+y \le 1$) capable of efficiently exciting a phosphor is particularly preferable. In addition, the light emitting element 1 may be formed of a material comprising a zinc sulfide-based semiconductor, zinc selenide-based semiconductor, or silicon carbide-based semiconductor.

Reflecting Member

The reflecting member 10 reflects the light from the light emitting element 1 for extraction via the wavelength conversion member 3. The reflecting member 10 has a first reflecting member 2 and a second reflecting member 4.

The first reflecting member 2 is a member for reflecting the light emitted by the light emitting element 1 and travelling laterally towards the wavelength conversion member 3 which is the emission region of the light emitting device 100. Furthermore, the first reflecting member 2 is a member for increasing contrast (i.e., difference in luminance) between the emission region and non-emission region during emission.

The first reflecting member 2 covers some portions of the outer lateral faces of the wavelength conversion member 3. In the present embodiment, the first reflecting member 2 covers the outer lateral faces of the wavelength conversion member 3 in a range from the lower edges of the inner lateral faces of the cover member 5 to the lower edges of the outer lateral faces of the wavelength conversion member 3.

The thickness of the first reflecting member 2 in the up and down direction at the outer lateral faces of the wavelength conversion member 3 is preferably larger than the thickness of the cover member 5 in the up and down direction at the outer lateral faces of the wavelength conversion member 3. Such a structure can further increase the contrast between the emission region and the non-emission region when emitting light. From the perspective of further increasing contrast between the emission region and the non-emission region during emission, the thickness of the first reflecting member 2 in the up and down direction at the outer lateral faces of the wavelength conversion member 3 is preferably at least twice, more preferably at least four times, the thickness of the cover member 5 in the up and down direction at the outer lateral faces of the wavelength conversion member 3.

The second reflecting member 4 is a member for reflecting the light emitted by the light emitting element 1 and travelling laterally or downwards towards the wavelength conversion member 3 which is the emission region of the light emitting device 100.

The second reflecting member 4 is disposed on the lateral face sides of the light emitting element 1 and under the wavelength conversion member 3. Specifically, the second reflecting member 4 covers the lower face (i.e., the side on which the electrodes 11 and 12 are provided) of the light emitting element 1. The second reflecting member 4 surrounds and covers via a light guide member 6 the regions of the lateral faces of the light emitting element 1 that are covered by the light guide member 6, while directly covering the regions of the lateral faces of the light emitting element not covered by the light guide member 6.

The second reflecting member 4 in the present embodiment is disposed via the light guide member 6 formed on the lateral faces of the light emitting element 1, but may be disposed directly on the lateral faces of the light emitting element 1 without disposing a light guide member 6.

The reflecting member 10, for example, is a resin layer that contains at least one reflecting substance. The reflecting member 10 may be structured by a base material or binder containing at least one filler in addition to at least one reflecting substance.

A binder in the reflecting member 10 is a resin for binding the reflecting substance and the filler described earlier to the lateral face sides and the lower face (i.e., the side on which the electrode 11 and 12 are formed) of the light emitting element 1 and the lateral faces of the wavelength conversion member 3. Examples of resins used as a binder include polycarbonate, epoxy, phenol, silicone, acrylic, TPX, polynorbornene, and urethane resins. Other examples of resins serving as a binder include modified resins of these, and hybrid resins containing one or more of these resins. Among such resins, silicone resins or their modified resins are preferable because they are highly heat resistant and highly light resistant, and have less volumetric shrinkage after being cured.

A reflecting substance is a substance that reflects the light emitted by the light emitting element 1. Examples of reflecting substances include silica, titanium oxide, silicon oxide, aluminum oxide, potassium titanate, zinc oxide, boron nitride, and the like. Resin powder such as silicone powder may alternatively be used.

A filler may be added for the purpose of increasing the strength of the reflecting member 10 which is a resin layer, or increasing the thermal conductivity of the reflecting member 10. Examples of fillers include glass fibers, whiskers, aluminum oxide, silicon oxide, boron nitride, zinc oxide, aluminum nitride, and the like.

Light Guide Member

The light guide member 6 facilitates light extraction from the light emitting element 1 by guiding the light from the light emitting element 1 to the wavelength conversion member 3. The light guide member 6 can increase luminous flux and light extraction efficiency.

The light guide member 6 is formed by allowing the bonding member for bonding the wavelength conversion member 3 and the light emitting element 1 to creep up or drop down onto the lateral faces of the light emitting element 1 (during the manufacturing step, the structure is oriented upside down).

For the light guide member 6, a light transmissive resin material, for example, can be used. Examples of materials for the light guide member 6 include light transmissive adhesive materials such as the resins employed as the base material or binder for the reflecting member 10 described earlier. Moreover, it may contain a diffusing agent such as silica, titanium oxide, silicon oxide, aluminum oxide, potassium titanate, zinc oxide, boron nitride and the like. This can allow the light to enter the wavelength conversion member 3 more evenly thereby attenuating color-nonuniformity of the light emitting device 100.

The light guide member 6, as shown in FIG. 1B, is formed into a triangular shape in a cross-sectional view so that the width of the light guide member 6 spreads from the lower face (i.e., the side on which the electrodes 11 and 12 are provided) of the light emitting element 1 towards the wavelength conversion member 3. Such a shape can further increase luminous flux and light extraction efficiency. However, the shape of the light guide member 6 is not restricted in particular. For example, the lateral surfaces of the light guide member 6 may be curved surfaces projected toward the light emitting element 1, or curved surfaces projected toward the second reflecting member 4.

The light guide member 6 may cover portions of the lateral faces of the light emitting element 1, but preferably covers substantially the entire lateral faces of the light emitting element 1 from the perspective of increasing luminous flux and light extraction efficiency.

The light guide member 6, moreover, may be disposed between the wavelength conversion member 3 and the light emitting element 1.

Wavelength Conversion Member

The wavelength conversion member 3 contains at least one wavelength conversion substance. The wavelength conversion substance absorbs a portion of the light emitted by the light emitting element 1, and converts into and emits light having a different wavelength. The wavelength conversion substance used in the wavelength conversion member 3 is, for example, a phosphor. The explanation below assumes that the wavelength conversion member is a phosphor.

The wavelength conversion member 3 is disposed on the emission face of the light emitting element 1 and on the light guide member 6.

The lower face of the wavelength conversion member 3, in other words, a surface facing the emission face of the light emitting element 1, is formed larger than the emission face which is the upper face of the light emitting element 1.

The base material or binder for the wavelength conversion member 3 is preferably formed of a material comprising a light transmissive resin. Examples of the resin here include those resins used as the base material or binder for the reflecting member 10 described earlier. Among such resins, silicone resins or their modified resins are preferable because they are highly heat resistant and highly light resistant as well as having less volumetric shrinkage after being cured. The base material or binder for the wavelength conversion member 3, moreover, may be formed with a ceramic or glass besides a resin.

Examples of phosphors to be contained in the wavelength conversion member 3 include cerium-activated yttrium aluminum garnet, cerium-activated lutetium aluminum garnet, cerium-activated terbium aluminum garnet, nitride-containing aluminocalcium silicate activated by one or both of europium and chromium, europium-activated SiAlON, europium-activated silicate, manganese-activated potassium fluorosilicate, and the like.

In the present embodiment, as described later, as long as the body color of the wavelength conversion member 3 and the body color of the cover member 5 are the same or similar in colors, the body color of the phosphor can be any color. A body color refers to the color of a member when the light emitting device 100 is not emitting light.

For example, in the case of using a phosphor whose body color is white, the body color of the wavelength conversion member 3 becomes white. For this reason, as described later, if the body color of the wavelength conversion member 3 and the body color of the cover member 5 were the same or similar in colors, the entire upper face of the light emitting device 100 would be white color.

In the case of using the light emitting device 100 as a white light source for a lighting device such as a flashlight of a camera, for example, a light emitting element having a blue emission color and a phosphor having a yellow emission color and a yellow body color are preferably used. It is also preferable to use a light emitting element having a blue emission color and a phosphor having an orange emission color and an orange body color.

Examples of phosphors having a yellow body color and a yellow emission color include yttrium aluminum garnet-based phosphors (YAG-based phosphors), lutetium aluminum garnet-based phosphors (LAG-based phosphors), terbium aluminum garnet-based phosphors (TAG-based phosphors), and the like. Examples of phosphors having a yellow body color and a red emission color include KSF. The body colors of these phosphors are 10Y or 5Y in the Munsell hue circle of the Munsell color system (20 hues).

Examples of phosphors having an orange body color and a red emission color include SCASN, CASN, and the like. The body color of these phosphors is 10YR or 5YR in the Munsell hue circle of the Munsell color system (20 hues).

Moreover, a combination of a phosphor having a yellow emission color and a phosphor having a red emission color can make the emission color orange.

Furthermore, examples of colors of phosphors where the body color of the phosphor is yellow or orange include hues 5YR, 10YR, 5Y, and 10Y in the Munsell hue circle of the Munsell color system (20 hues).

In the case of a yellow phosphor, the body color of the phosphor is, for example, 10Y or 5Y. In the case of an orange phosphor, the body color of the phosphor is, for example, 10YR or 5YR. A phosphor having a yellow body color will be explained below using 5Y in the Munsell hue circle of the Munsell color system (20 hues) as an example.

In the Munsell color system, the lightness, for example, is in a range of from 7 to 9.

In the Munsell color system, the chroma, for example, is in a range of from 4 to 14.

The wavelength conversion member 3 may contain a diffusing agent. The diffusing agent is added to efficiently diffuse the light emitted from the light emitting element 1 and the phosphor. Examples of diffusing agents are similar to those listed earlier as reflecting substances contained in the reflecting member 10.

The thickness of the wavelength conversion member 3 in the up and down direction can be set according to the phosphor content, the color tone obtained after combining the light emitted by the light emitting element 1 and the light emitted by the phosphor, and the like, and can be set to, for example, in a range of from 50 μm to 300 μm.

Cover Member

The cover member 5 is a member that is disposed on the upper face of reflecting member 10 while being adjacent to the peripheral ends of the wavelength conversion member 3. The thickness of the cover member 5 in the up and down direction is smaller than the thickness of the wavelength conversion member 3 in the up and down direction. The cover member 5, moreover, is formed to be constant in thickness in the up and down direction. The cover member 5 covers the upper parts of the outer lateral faces of the wavelength conversion member 3.

The cover member 5, for example, is a resin layer. Examples of resins used as the base material or binder for the cover member 5 include those resins described earlier which can be used as the base material or binder for the reflecting member 10. Among such resins, epoxy resins or their modified resins have good adhesive and gas barrier properties, and thus are preferable. Furthermore, silicone resins and their modified resins are highly heat resistant and highly light resistant, as well as having less volumetric shrinkage after being cured, and thus are preferable. The cover member 5, furthermore, may be formed of a material comprising a ceramic or glass besides resins.

The cover member 5 contains at least one of a pigment and a dye.

No particular restrictions apply to pigments. Examples include those employing inorganic or organic materials such as those listed below.

Examples of inorganic materials include red iron oxide ($Fe_2O_3$), red lead ($Pb_3O_4$), antimony nickel titanium-based oxide, barium nickel titanium-based oxide, antimony chromium titanium-based oxide, niobium chromium titanium-based oxide, and the like.

Examples of organic materials include anthraquinone-, azo-, quinacridone-, perylene-, diketopyrrolopyrrole-, monoazo-, disazo-, pyrazolone-, benzimidazolone-, quinoxaline-, azomethine-, isoindolinone-, isoindoline-based materials, and the like.

No particular restrictions apply to dyes, and examples include anthraquinone-based dyes, methine-based dyes, azomethine-based dyes, oxazine-based dyes, azo-based dyes, styryl-based dyes, coumarin-based dyes, porphyrin-based dyes, dibenzo-furanone-based dyes, diketopyrrolopyrrole-based dyes, rhodamine-based dyes, xanthene-based dyes, pyromethene-based dyes, and the like.

Pigments and dyes basically are preferably those that do not convert the light from the light emitting element 1 into light having a different wavelength.

The body color of the wavelength conversion member 3 and the body color of the cover member 5 are of the same or similar colors. "The same or similar colors" here in terms of the Munsell color system (20 hues) means having:

hue in the range of three in the hue circle;

lightness in the range of three; and chroma in the range of three. In other words, "the same or similar colors" include neighboring colors on adjacent sides in terms of hue, lightness, and chroma in the Munsell color system (20 hues).

Figure 2:
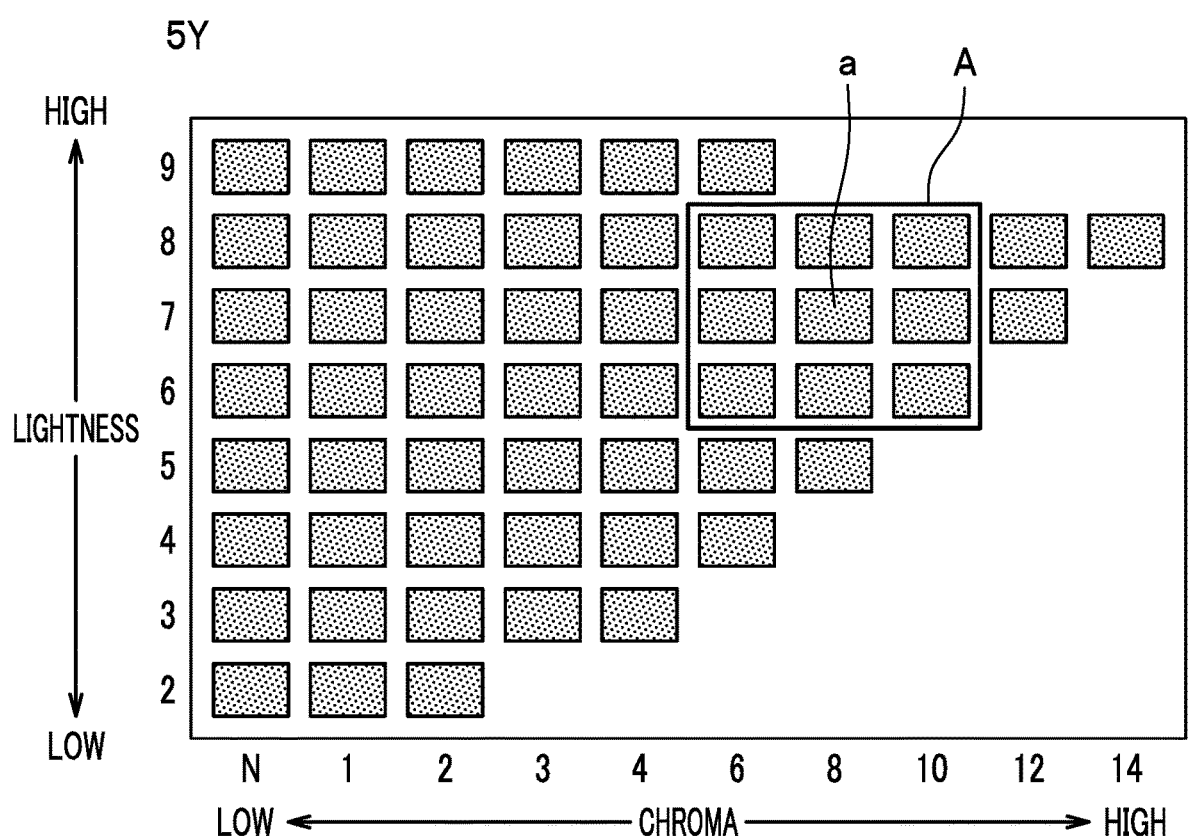
FIG. 2 is a chart schematically showing constant hue plates of a hue (5Y) in the Munsell color system.

Specifically, for example, assuming that a certain color having a Y (yellow) hue as color a of the constant hue plates (5Y) in the Munsell color system shown in FIG. 2, those in a range A are defined as the same or similar colors.

The body color can be measured by using a measuring instrument, such as a CM series spectrophotometer (manufactured by Konica Minolta), CR series color difference meter (manufactured by Konica Minolta), or the like. Such measuring instruments having a xenon lamp light source and a silicon photodiode photodetector capable of performing spectral dispersion using plane diffraction grating and outputting in the form of the Munsell color system can simply be used.

Making the body color of the wavelength conversion member 3 and the body color of the cover member 5 the same or similar colors can make the entire upper face of the light emitting device 100 the color of the wavelength conversion member 3 when not emitting light.

"The entire upper face of the light emitting device 100 when not emitting light being the color of the wavelength conversion member 3" includes the color of the entire upper face of the light emitting device 100 being the same, or substantially the same, as the color of the wavelength conversion member 3. "Substantially the same" can include neighboring colors on adjacent sides of the constant hue plate in terms of hue, lightness, and chroma in the Munsell color system (20 hues) described above.

Operation of Light Emitting Device

The operation of the light emitting device 100 will be explained next.

When the light emitting device 100 is driven, the light emitting element 1 emits light as power is supplied to the light emitting element 1 from an external power supply via the electrodes 11 and 12. A portion of the light emitted by the light emitting element 1 is reflected by the first reflecting member 2 and the second reflecting member 4, which passes through the wavelength conversion member 3 to be extracted. At this point, having the first reflecting member 2 can increase the contrast (i.e., difference in luminance) between the emission region and the non-emission region at the upper face of the light emitting device 100.

Method of Manufacturing Light Emitting Device

Next, one example of the method of manufacturing the light emitting device 100 related to the first embodiment will be explained with reference to FIG. 3 to FIG. 5C. In FIG. 4A to FIG. 5C, a single light emitting device 100 among multiple light emitting devices 100 simultaneously manufactured is schematically illustrated.

Figure 3:
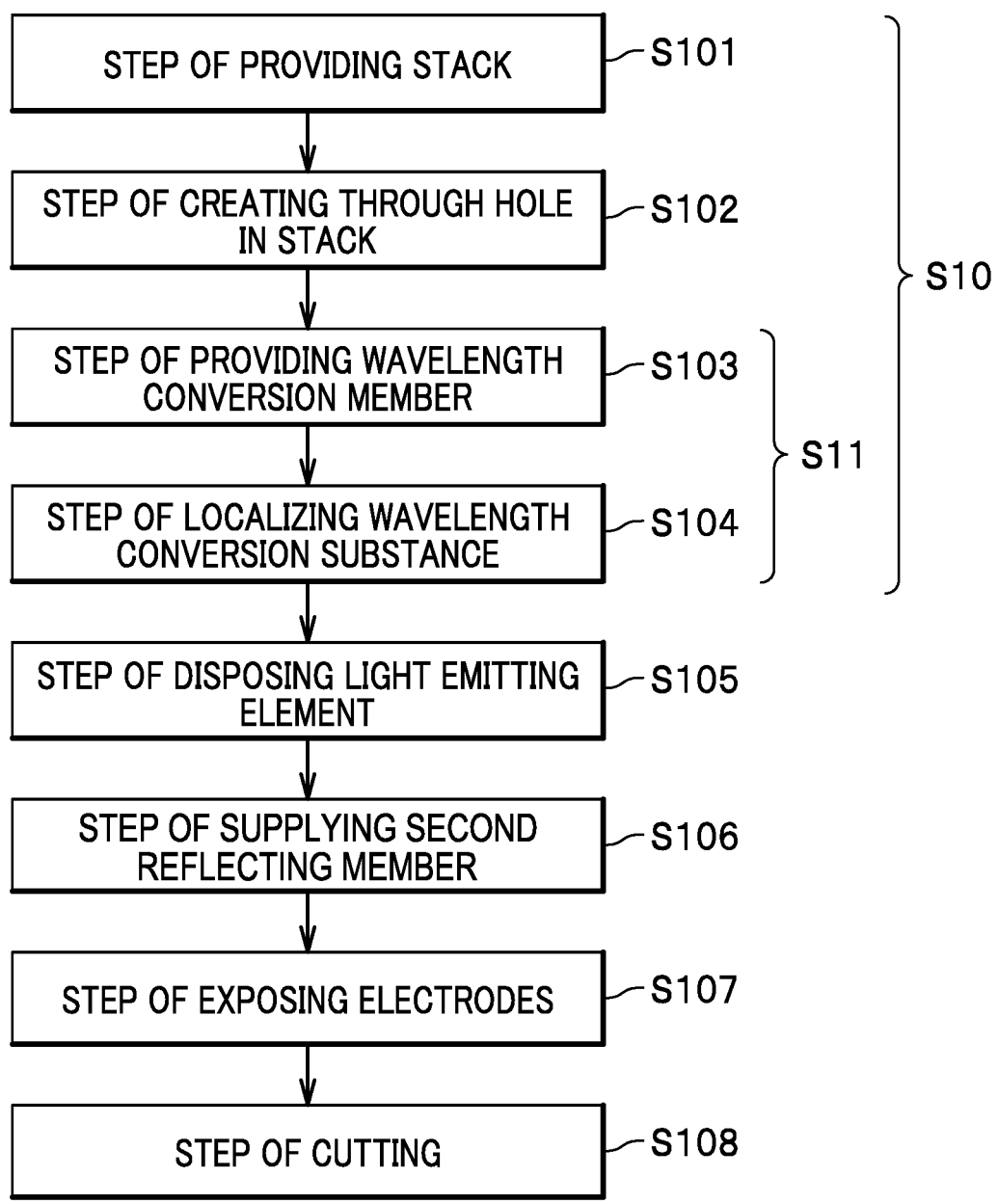
FIG. 3 is a flowchart for the method of manufacturing the light emitting device related to the first embodiment.

As shown in FIG. 3, the method of manufacturing the light emitting device 100 related to the first embodiment includes: a step S10 of providing a plate-shaped member, a step S105 of disposing a light emitting element; a step S106 of supplying a second reflecting member, a step S107 of exposing electrodes; and a step S108 of cutting a workpiece, which are performed in that order. The materials and layout of the members are as described above with reference to the light emitting device 100, and thus the explanations here will be omitted when appropriate.

Step of Providing Plate-Shaped Member

The step S10 of providing a plate-shaped member is a step of providing a plate-shaped member 17 which includes a stack 15 of a first reflecting member 2 and a cover member 5 containing at least one of a pigment or dye, and a wavelength conversion member 3 disposed in the through hole 16 of the stack 15.

The step of providing a plate-shaped member includes a step S101 of providing a stack, a step S102 of creating a through hole in the stack, and a step S11 of supplying a wavelength conversion member, which are performed in that order.

Step of Providing Stack

Figure 4A:
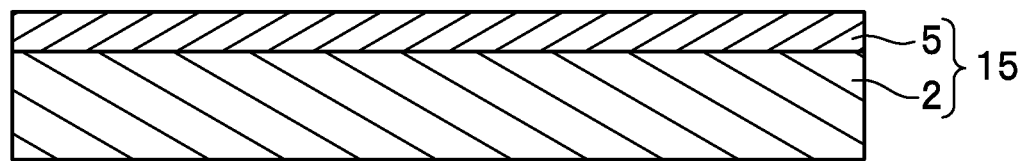
FIG. 4A is a cross-sectional view showing a step of providing a stack in the method of manufacturing the light emitting device related to the first embodiment.
Figure 4B:
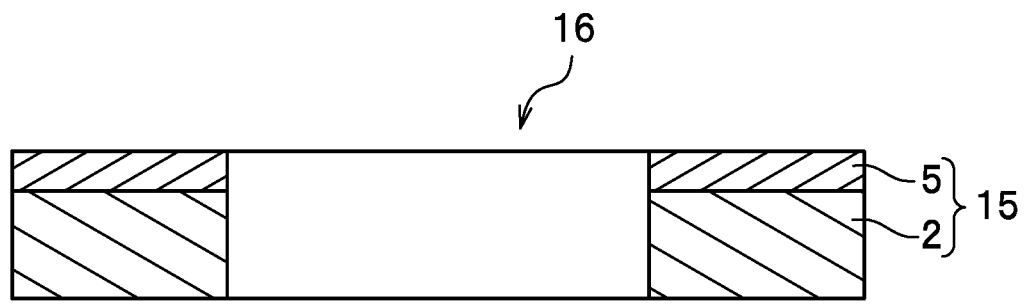
FIG. 4B is a cross-sectional view showing a step of creating a through hole in the stack in the method of manufacturing the light emitting device related to the first embodiment.

Step S101 of providing a stack, as shown in FIG. 4A, is a step of providing a stack 15 in which a first reflecting member 2 and a cover member 5 containing at least one of a pigment or dye are stacked.

In the step S101, the stack 15 can be formed by adhering together a sheet-shaped first reflecting member 2 and a sheet-shaped cover member 5. In the step S101, the stack 15 can alternatively be formed by disposing the cover member 5 on the upper face of the sheet-shaped first reflecting member 2 by printing or spraying.

Step of Creating Through Hole in Stack

Figure 13A:
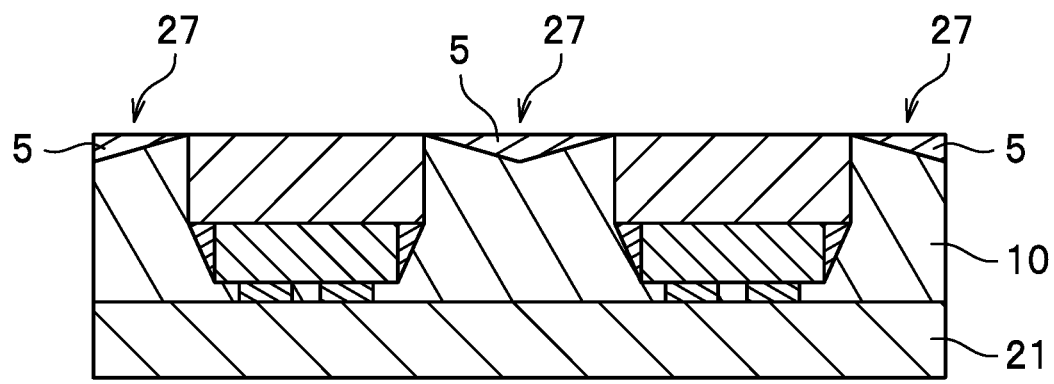
FIG. 13A is a cross-sectional view showing a step of supplying a cover member in the recessed portions in the method of manufacturing the light emitting device related to the third embodiment.
Figure 13B:
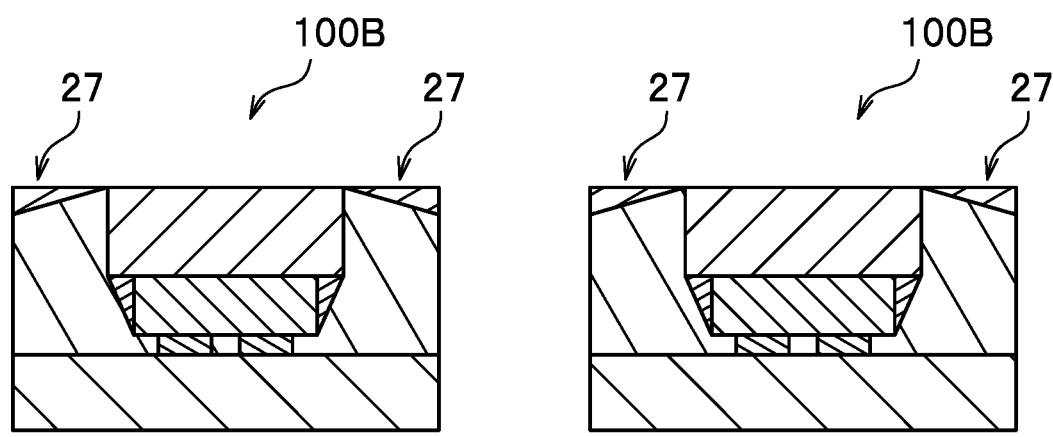
FIG. 13B is a cross-sectional view showing a step of cutting workpieces into individual devices in the method of manufacturing the light emitting device related to the third embodiment.

The step S102 of creating a through hole in the stack, as shown in FIG. 13B, is a step of creating a through hole 16 at a prescribed location of the stack 15.

In the step S102, a through hole 16 is created at the location where the wavelength conversion member 3 of the light emitting device 100C is to be formed. The creation of the through hole 16 can be accomplished by punching a hole in a perpendicular direction or a direction inclined at certain degrees from the perpendicular direction from the upper face of the cover member 5 to the lower face of the first reflecting member 2 using, for example, a die and a punch.

The diagonal or diameter of the through hole 16 can be suitably selected. The diagonal or diameter of the through hole 16 can be set, for example, to 200 μm to 1200 μm. When the diagonal or diameter of the through hole 16 is larger than the diagonal or diameter of the light emitting element 1, light extraction efficiency can be increased. When the diagonal or diameter of the through hole 16 is smaller than the diagonal or diameter of the light emitting element 1, the emission region can be reduced to thereby increase the luminance.

The shape of the through hole 16 can be, for example, a rectangle, hexagon, circle, or the like in a top view. Furthermore, the shape of the through hole 16 is preferably mathematically similar to the shape of the light emitting element 1 from the perspective of luminous intensity distribution.

Step of Supplying Wavelength Conversion Member

Figure 4C:
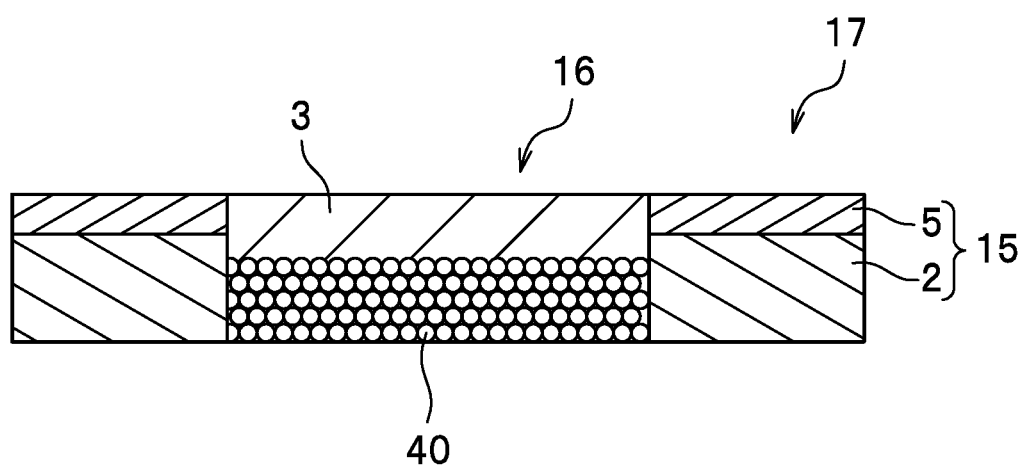
FIG. 4C is a cross-sectional view showing a step of supplying a wavelength conversion member in the through hole in the method of manufacturing the light emitting device related to the first embodiment.

The step 11 of supplying wavelength conversion member, as shown in FIG. 4C, is a step of supplying a wavelength conversion member 3 in the through hole 16.

The step 11 of supplying a wavelength conversion member includes the step S103 of providing a wavelength conversion member and the step S104 of localizing a wavelength conversion substance, which are performed in that order.

Step of Providing Wavelength Conversion Member

The step S103 of providing a wavelength conversion member is a step of providing a wavelength conversion member 3 which contains a wavelength conversion substance and a resin.

In the step S103, the wavelength conversion substance and the resin are combined to provide the wavelength conversion member 3.

Step of Localizing Wavelength Conversion Substance

The step S104 of localizing a wavelength conversion substance, as shown in FIG. 4C, is a step of localizing a wavelength conversion substance 40 on or near the face of the wavelength conversion member 3 on the cover member 5 side (i.e., the face opposite the face on which the light emitting element 1 is to be disposed) or the face thereof on the outer surface side of the first reflecting member 2 (i.e., the face on which the light emitting element 1 is to be disposed) after supplying the wavelength conversion member 3 in the through hole 16. In the present embodiment, the case where the wavelength conversion substance 40 is localized on or near the face of the wavelength conversion member 3 on the outer surface side of the first reflecting member 2 is illustrated. In this case, the thickness of the portion of the wavelength conversion member 3 where the wavelength conversion substance 40 is localized in the up and down direction is preferably smaller than the thickness of the first reflecting member 2 in the up and down direction. This can easily increase the contrast between the emission region and the non-emission region during emission. The wavelength conversion substance 40 will be omitted in the subsequent schematic diagrams.

In the step S104, after disposing the wavelength conversion member 3 in the through hole 16, the wavelength conversion substance 40 in the resin is allowed to settle naturally or by force to be localized on or near the face of the wavelength conversion member 3 on the cover member 5 side or the outer surface side of the first reflecting member 2. Subsequently, the resin is cured by heating or the like. In this manner, the wavelength conversion member 3 with a localized wavelength conversion substance 40 is obtained.

Step of Disposing Light Emitting Element

Figure 5A:
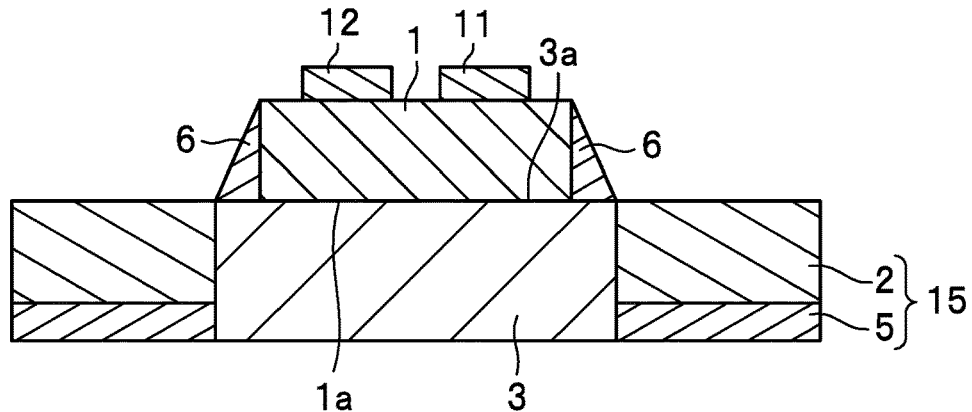
FIG. 5A is a cross-sectional view showing a step of disposing a light emitting element in the method of manufacturing the light emitting device related to the first embodiment.

The step S105 of disposing a light emitting element, as shown in FIG. 5A, is a step of disposing a light emitting element 1 so that the emission face 1a faces the first face 3a of the wavelength conversion member 3 surrounded by the first reflecting member 2.

In the step S105, the face of the light emitting element 1 opposite the face on which the electrodes 11 and 12 are disposed, i.e., the emission face 1a, is bonded to the first face 3a of the wavelength conversion member 3 via a bonding member. At this time, from the perspective of light distribution, the two are preferably bonded so that the center of the first face 3a of the wavelength conversion 3 coincides with the center of the emission face 1a of the light emitting element 1 when viewed from the top.

In the present embodiment, the bonding member can be formed on the lateral faces of the light emitting element 1 by adjusting the amount of the bonding member to allow the bonding member to creep up the lateral faces of the light emitting element 1. In this manner, the light emitting device 100 will have the form in which a light guide member 6 serving as a bonding member is disposed on the lateral faces of the light emitting element 1.

Alternatively, the light guide member 6 which is the bonding member may be disposed between the emission face 1a of the light emitting element 1 and the first face 3a of the wavelength conversion member 3 to a predetermined thickness in the up/down direction. This can more firmly bond the light emitting element 1 and the wavelength conversion member 3 together. Although not shown in the drawings, the bonding member, which is extremely thin, is interposed between the emission face 1a of the light emitting element 1 and the first face 3a of the wavelength conversion member 3 to bond together the light emitting element 1 and the wavelength conversion member 3.

Step of Supplying Second Reflecting Member

Figure 5B:
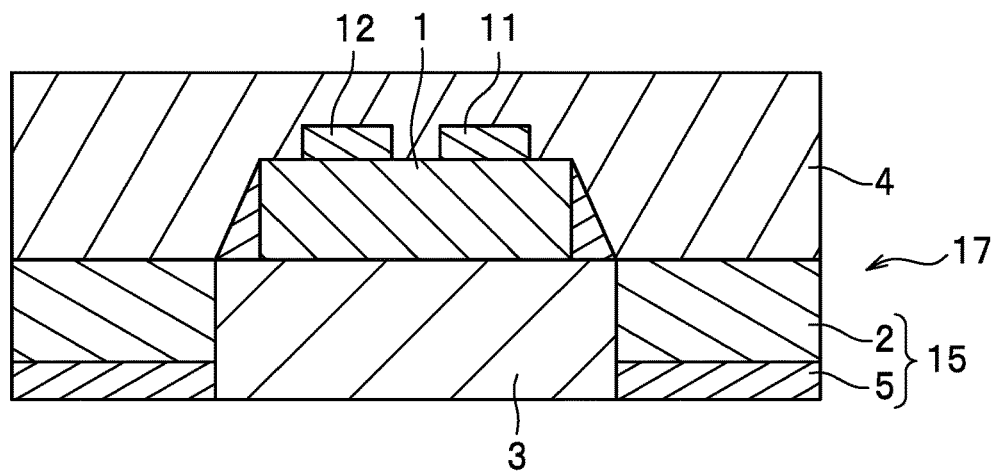
FIG. 5B is a cross-sectional view showing a step of supplying a second reflecting member to cover the light emitting element, etc. in the method of manufacturing a light emitting device related to the first embodiment.

The step S106 of supplying a reflecting member, as shown in FIG. 5B, is a step of covering at least the light emitting element 1 with a reflecting member 4.

In the step S106, the entire light emitting element 1 including the electrodes 11 and 12 is covered with the second reflecting member 4. In the step S106, the second reflecting member 4 is disposed from the surface of the first reflecting member 2 to the upper faces of the electrodes 11 and 12.

The light emitting element 1 can be covered, for example, by using a dispenser which is positioned above the fixed plate-shaped member 17 and movable in the up/down or lateral direction relative to the plate-shaped member 17. The second reflecting member 4 is formed by supplying a resin to-be the second reflecting member 4 on the plate-shaped member 17 by using a dispenser.

This can alternatively be accomplished by compression molding, transfer molding, or the like.

Step of Exposing Electrodes

Figure 5C:
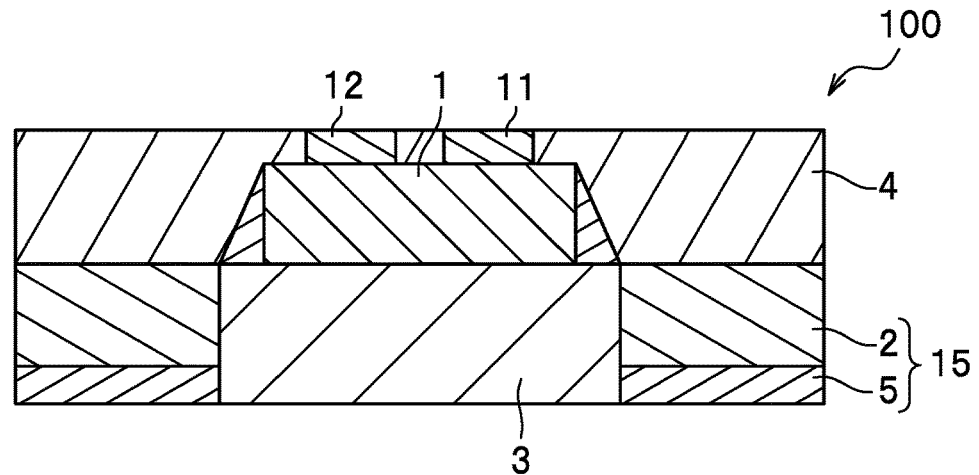
FIG. 5C is a cross-sectional view showing a step of exposing the electrodes from the second reflecting member in the method of manufacturing the light emitting device related to the first embodiment.

The step S107 of exposing electrodes, as shown in FIG. 5C, is a step of removing a portion of the second reflecting member 4 on the side where the electrodes 11 and 12 are located so as to expose the electrodes 11 and 12 of the light emitting element 1.

In the step S107, for example, from the side where the electrodes 11 and 12 are disposed, the surface of the second reflecting member 4 is removed until the electrodes 11 and 12 are exposed. Examples of methods for removing the second reflecting member 4 include grinding, polishing, blasting, and the like.

Step of Cutting

The step S108 of cutting a workpiece is a step of cutting the collective body of light emitting devices 100 arranged in multiple rows and columns so as to run through along the cutlines. That is, the step S108 of cutting the workpiece is a step of dividing the collective body of simultaneously manufactured light emitting devices 100 into individual devices.

In the step S108, the cutlines for dividing the collective body of the light emitting devices 100 into individual devices are predefined. The cutlines are defined so that the light emitting devices 100 will be equal size thereto.

The collective body can be divided into individual devices by conventionally known methods, such as dicing by which the collective body is cut along cutlines using a blade, breaking by which the collective body is split along cutlines after scribing, or the like.

Multiple light emitting devices 100 are obtained as a result of dividing the collective body into individual pieces.

Second Embodiment

Light Emitting Device

Next, the light emitting device related to a second embodiment will be explained.

Figure 6A:
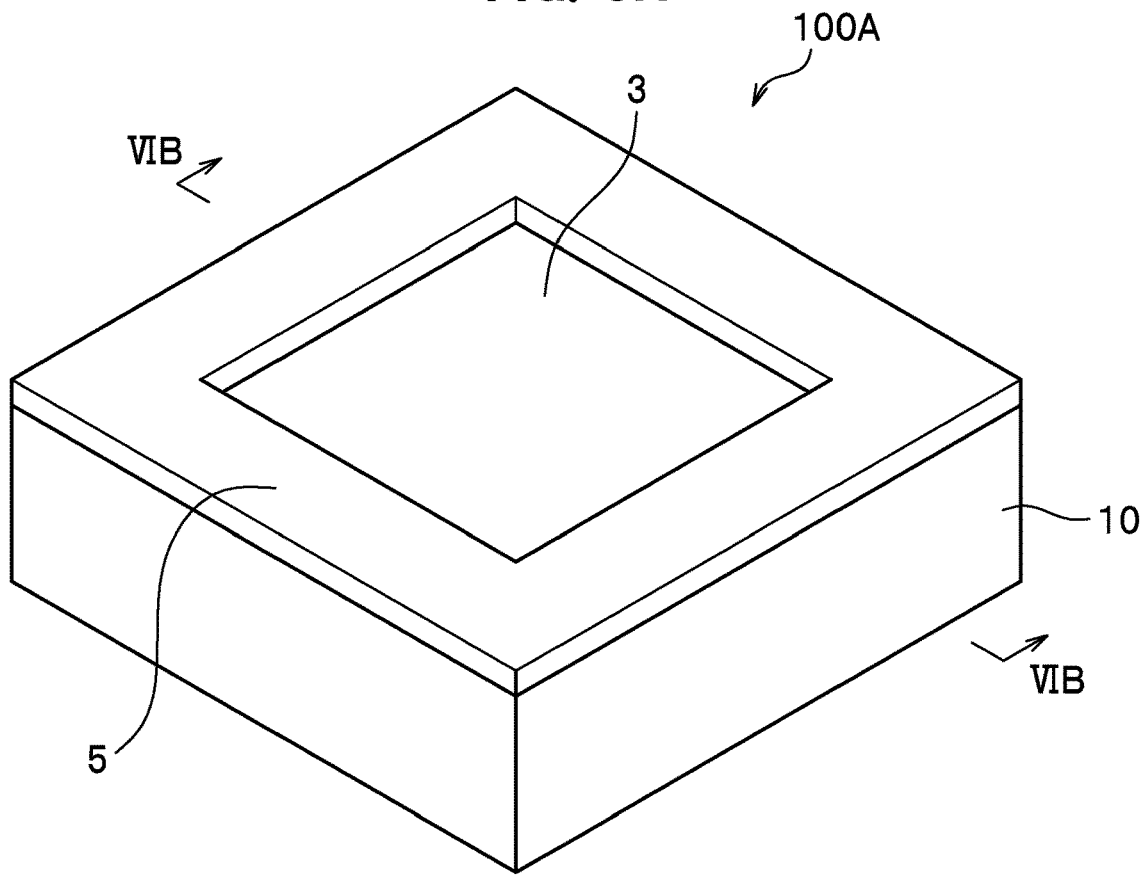
FIG. 6A is a perspective view schematically showing a structure of a light emitting device related to a second embodiment.
Figure 6B:
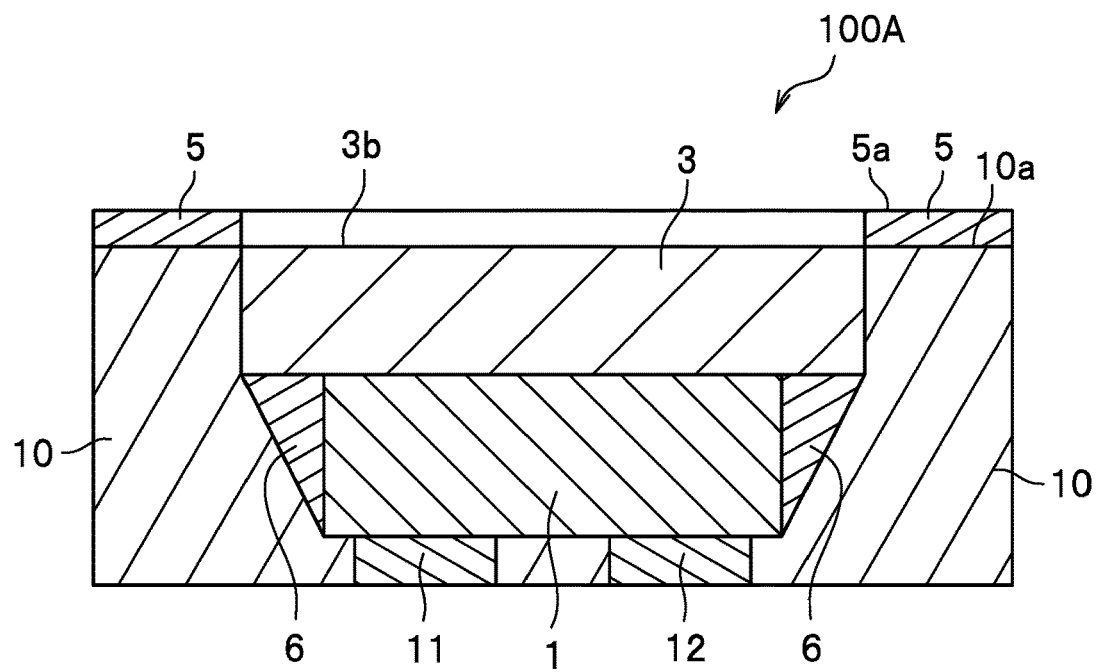
FIG. 6B is a cross-sectional view taken along line VIB-VIB in FIG. 6A.

As shown in FIG. 6A and FIG. 6B, the light emitting device 100A includes a light emitting element 1, a reflecting member 10, a wavelength conversion member 3, and a cover member 5. Moreover, the light emitting device 100A has a light guide member 6 disposed on the lateral faces of the light emitting element 1.

In the present embodiment, the differences from the first embodiment will primarily be explained.

In the light emitting device 100A, the upper face 10a of the reflecting member 10 is flush with the second face 3b of the wavelength conversion member 3. Furthermore, the reflecting member 10 covers from the upper edges to the lower edges of the outer lateral faces of the wavelength conversion member 3. Moreover, the cover member 5 has a constant thickness in the up and down direction, and the upper face 5a of the cover member 5 is positioned higher than the second face 3b of the wavelength conversion member 3.

The cover member 5 is formed into a frame shape with an opening formed in the area opposing the second face 3b of the wavelength conversion member 3.

The reflecting member 10 is not necessarily constructed as a single member shown in FIG. 6A and FIG. 6B, and may alternatively be constructed with multiple members as in the case of the first reflecting member 2 and the second reflecting member 4 shown in FIG. 1A and FIG. 1B.

The thickness of the cover member 5 in the up and down direction is preferably in a range from 10 µm to 100 µm, more preferably in a range from 15 µm to 60 µm. A thickness of the cover member 5 in the up and down direction of at least 10 µm can facilitate formation of the cover member 5. A thickness of the cover member 5 in the up and down direction of 100 µm at most can facilitate reduction in the size of the light emitting device 100A.

Method of Manufacturing Light Emitting Device

Next, one example of the method of manufacturing the light emitting device 100A related to the second embodiment will be explained with reference to FIG. 7 to FIG. 9C. In FIG. 8A to FIG. 9C, a single light emitting device 100A among multiple light emitting devices 100A simultaneously manufactured is schematically illustrated.

Figure 7:
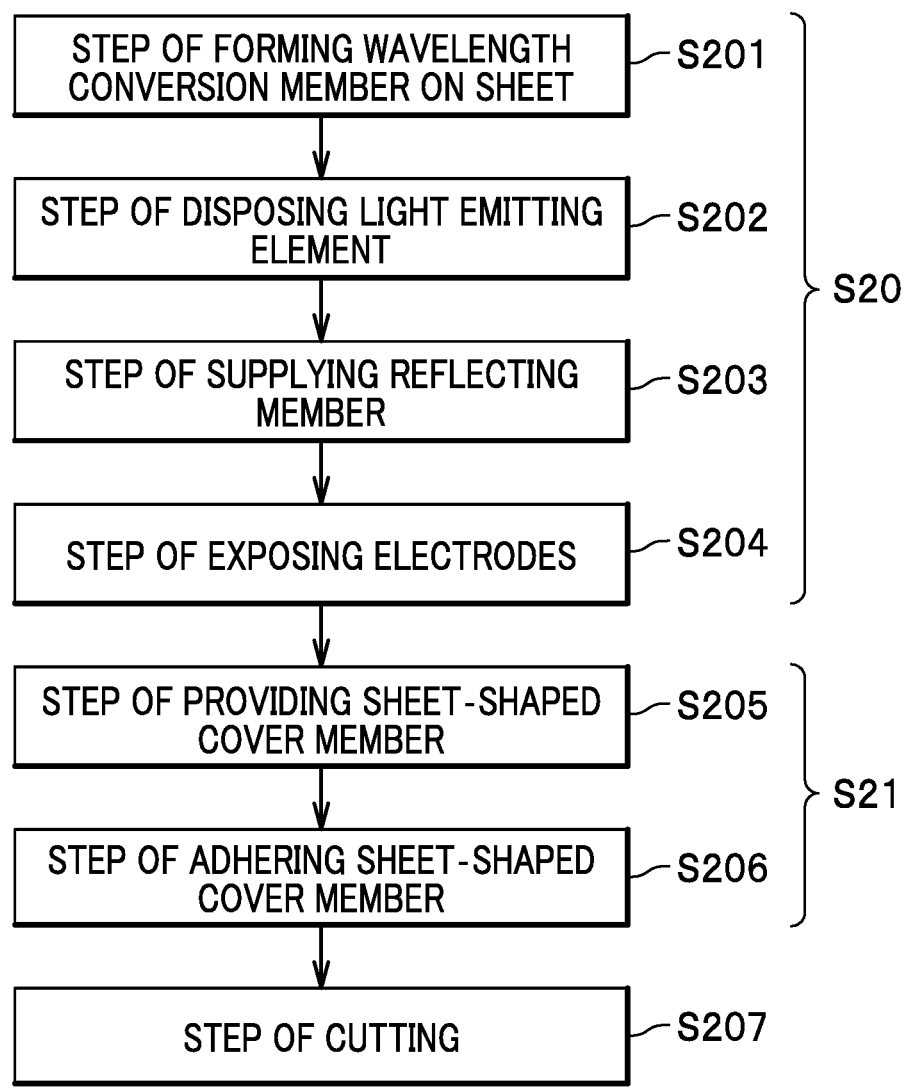
FIG. 7 is a flowchart for the method of manufacturing the light emitting device related to the second embodiment.

As shown in FIG. 7, the method of manufacturing the light emitting device 100A of the second embodiment includes a step S20 of providing a light emitting structure, a step S21 of disposing a cover member, and a step S207 of cutting, which are performed in that order.

The materials and layout of the members are as explained earlier with reference to the light emitting device 100A, and thus the explanations here will be omitted when appropriate.

Step of Providing Light Emitting Structure

The step S20 of providing a light emitting structure is a step of providing a light emitting structure 30 (see FIG. 9A) which includes a light emitting element 1, a wavelength conversion member 3 disposed on the emission face 1a of the light emitting element 1, and a reflecting member 10 disposed on the lateral face sides of the light emitting element 1 and the lateral faces of the wavelength conversion member 3.

The step S20 of providing a light emitting structure includes a step S201 of forming a wavelength conversion member on a sheet, a step S202 of disposing a light emitting element, a step S203 of supplying a reflecting member, and a step S204 of exposing electrodes, which are performed in that order.

Step of Forming Wavelength Conversion Member on Sheet

Figure 8A:
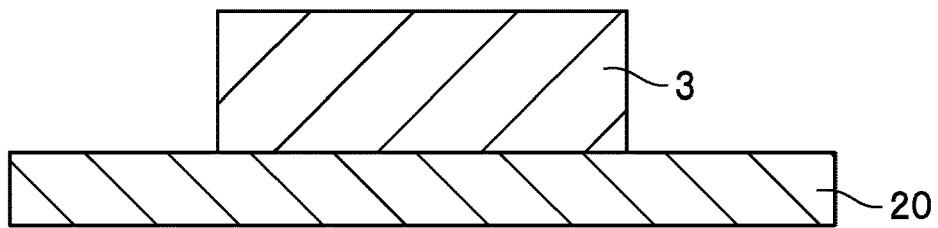
FIG. 8A is a cross-sectional view showing a step of forming a wavelength conversion member on a sheet in the method of manufacturing the light emitting device related to the second embodiment.

The step S201 of forming a wavelength conversion member on a sheet, as shown in FIG. 8A, is a step of forming a wavelength conversion member 3 on a sheet 20 of a resin or the like.

The wavelength conversion member 3 can be formed on the sheet 20, for example, by printing, compression molding, phosphor electrodeposition, stacking sheet-shaped wavelength conversion layers, or the like. The diagonal or diameter of the wavelength conversion member 3 can be suitably selected. The diagonal or diameter of the wavelength conversion member 3 can be set to, for example, in a range from 200 µm to 1200 µm. When the diagonal or diameter of the wavelength conversion member 3 is larger than the diagonal or diameter of the light emitting element 1, light extraction efficiency can be increased. When the diagonal or diameter of the wavelength conversion member 3 is smaller than the diagonal or diameter of the light emitting element 1, the emission region can be reduced to thereby increase the luminance. The shape of the wavelength conversion member 3 can be, for example, a rectangular, hexagonal, or circular shape, or the like in a top view. Furthermore, the shape of the wavelength conversion member 3 is preferably mathematically similar to the shape of the light emitting element 1 from the perspective of light distribution.

Step of Disposing Light Emitting Element

Figure 8B:
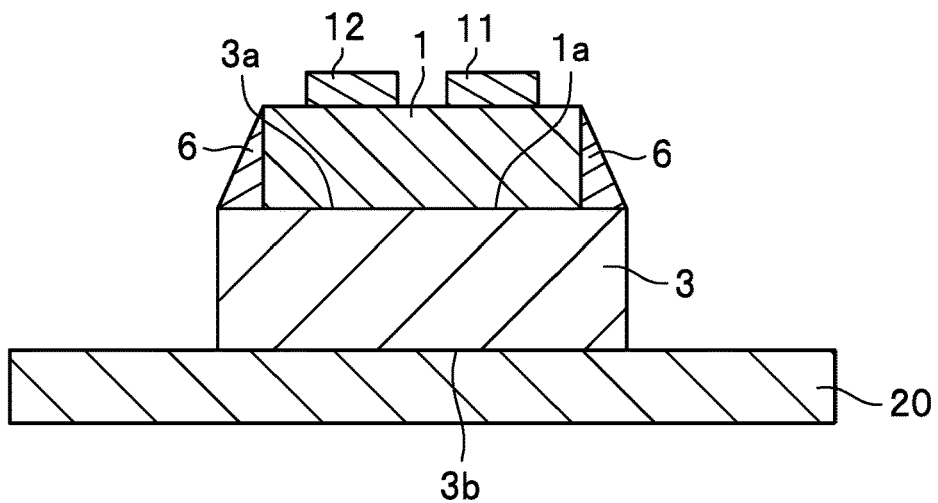
FIG. 8B is a cross-sectional view showing a step of disposing a light emitting element in the method of manufacturing the light emitting device related to the second embodiment.

The step S202 of disposing a light emitting element, as shown in FIG. 8B, is a step of disposing a light emitting element 1 so that the emission face 1a faces the first face 3a of the wavelength conversion member 3 which has a first face 3a and a second face 3b which opposes the first face 3a.

In the step S202, the face of the light emitting element 1 opposite the face on which the electrodes 11 and 12 are disposed, i.e., the emission face 1a, is bonded to the first face 3a of the wavelength conversion member 3 via a bonding member.

In the present embodiment, the bonding member can be formed on the lateral faces of the light emitting element 1 by adjusting the amount of the bonding member to allow the bonding member to creep up the lateral faces of the light emitting element 1. In this manner, the light emitting device 100A will have the form in which a light guide member 6 serving as a bonding member is disposed on the lateral faces of the light emitting element 1.

Alternatively, as explained with reference to the first embodiment, the light guide member 6 which is the bonding member may be disposed between the emission face 1a of the light emitting element 1 and the first face 3a of the wavelength conversion member 3 to a predetermined thickness in the up/down direction. Here, although not shown in the drawings, the bonding member having very small thickness is interposed between the emission face 1a of the light emitting element 1 and the first face 3a of the wavelength conversion member 3 to bond together the light emitting element 1 and the wavelength conversion member 3.

Step of Supplying Reflecting Member

Figure 8C:
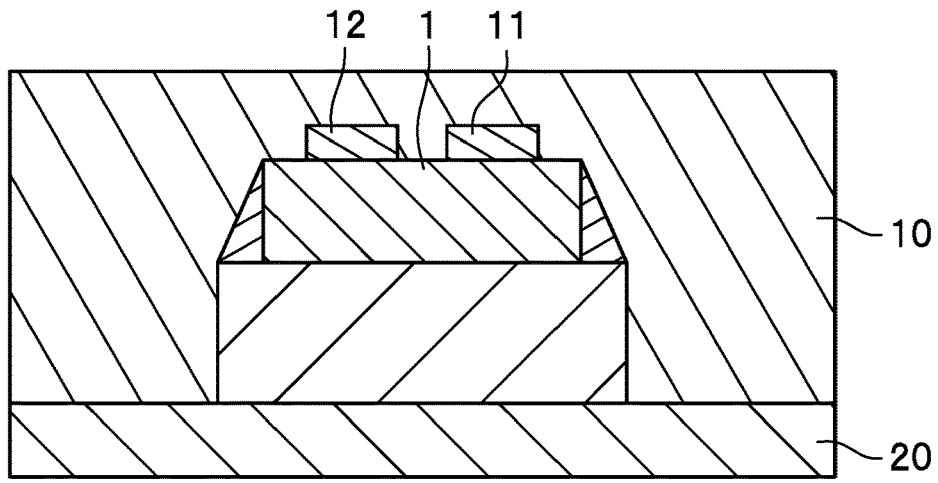
FIG. 8C is a cross-sectional view showing a step of supplying a reflecting member to cover the light emitting element, etc. in the method of manufacturing the light emitting device related to the second embodiment.

The step S203 of supplying a reflecting member, as shown in FIG. 8C, is a step of covering the light emitting element 1 disposed on the wavelength conversion member 3 with a reflecting member 10.

In the step S203, the entire light emitting element 1 including the electrodes 11 and 12 is covered with the reflecting member 10. In the step S203, the reflecting member 10 is disposed from the sheet 20 to the upper faces of the electrodes 11 and 12.

The light emitting element 1 can be covered, for example, by using a dispenser which is positioned above the fixed sheet 20 and movable in the up/down or lateral direction relative to the sheet 20. The reflecting member 10 is formed by supplying a resin to-be the reflecting member 10 on the wavelength conversion member 3 by using a dispenser.

This can alternatively be accomplished by compression molding, transfer molding, or the like.

Step of Exposing Electrodes

Figure 9A:
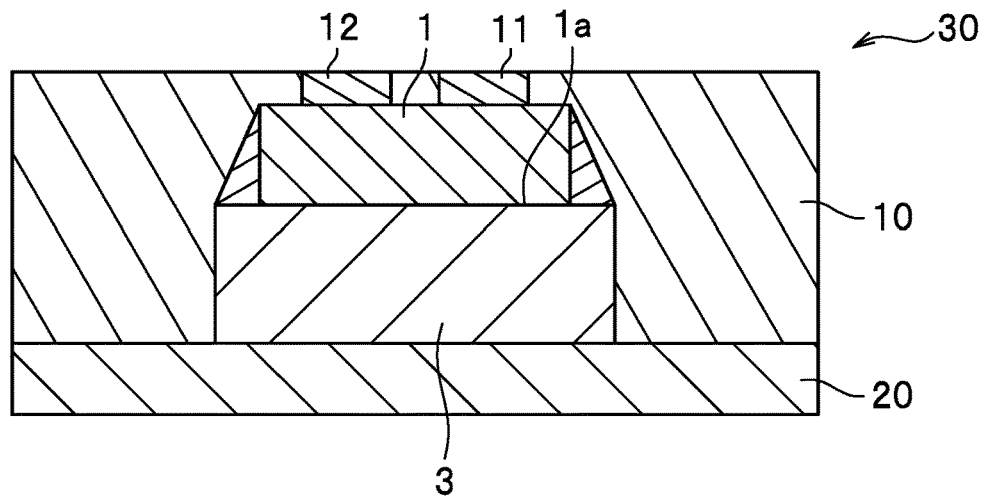
FIG. 9A is a cross-sectional view showing a step of exposing the electrodes from the reflecting member in the method of manufacturing the light emitting device related to the second embodiment.

The step S204 of exposing electrodes, as shown in FIG. 9A, is a step of removing a portion of the reflecting member 10 on the side where the electrodes 11 and 12 are located so as to expose the electrodes 11 and 12 of the light emitting element 1.

In the step S204, for example, the surface of the reflecting member 10 is ground or polished from the side where the electrodes 11 and 12 are disposed, until the electrodes 11 and 12 are exposed.

Step of Disposing Cover Member

The step S21 of disposing a cover member is a step of disposing a cover member 5 containing at least one of pigments and dyes on the reflecting member 10 at the peripheral ends of the wavelength conversion member 3.

The step S21 of disposing a cover member includes a step S205 of providing a sheet-shaped cover member and a step S206 of adhering the sheet-shaped cover member, which are performed in that order.

Step of Providing Sheet-Shaped Cover Member

Figure 9B:
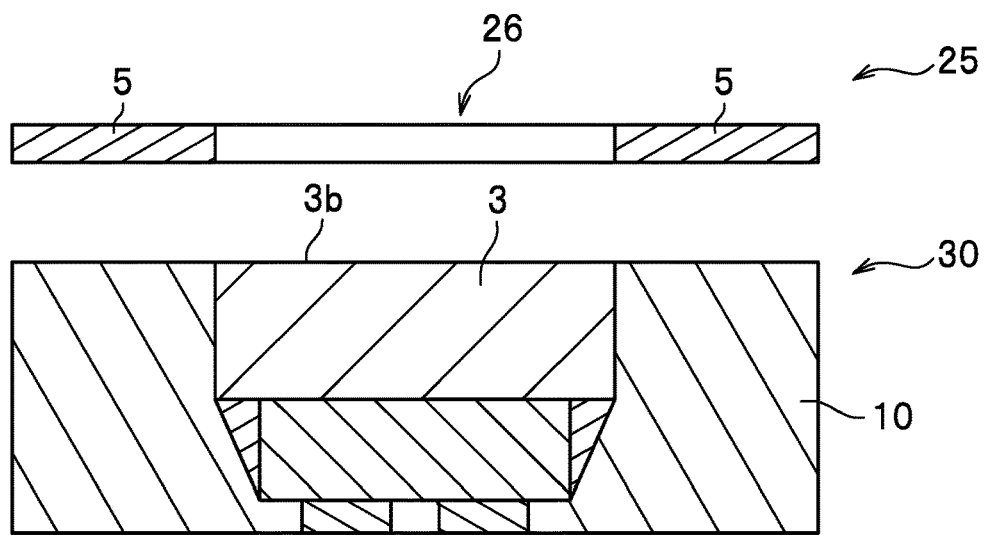
FIG. 9B is a cross-sectional view showing a step of providing a sheet-shaped cover member in the method of manufacturing the light emitting device related to the second embodiment.

The step S205 of providing a sheet-shaped cover member, as shown in FIG. 9B, is a step of providing a sheet-shaped cover member 5 having a through hole 26 at a predetermined location (hereinafter referred to as the frame 25 when suited). The frame 25 is formed so that the cover member 5 is placed on the upper face 10a of the reflecting member 10 which is on the wavelength conversion member 3 side in the up and down direction, and the through hole 26 is located on the second face 3b of the wavelength conversion member 3.

Step of Adhering Sheet-Shaped Cover Member

Figure 9C:
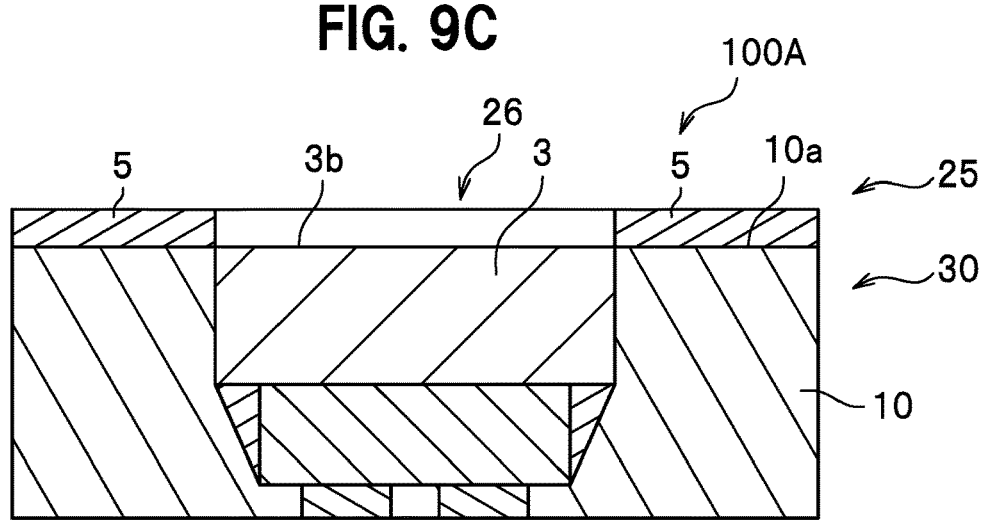
FIG. 9C is a cross-sectional view showing a step of adhering the sheet-shaped cover member in the method of manufacturing the light emitting device related to the second embodiment.

The step S206 of adhering the sheet-shaped cover member, as shown in FIG. 9C, is a step of adhering the frame 25 and the light emitting structure 30 together. The frame 25 and the light emitting structure 30 can be adhered together, for example, by using an adhesive. As a result of this adhesion, the cover member 5 is disposed on the upper face 10a of the reflecting member 10 which is on the wavelength conversion member 3 side in the up and down direction, and the through hole 26 is positioned at the second face 3b of the wavelength conversion member 3.

As a step of disposing a cover member, a step of providing a sheet-shaped cover member and a step of adhering the sheet-shaped cover member have been explained without limitations. The step of disposing a cover member can be accomplished by directly disposing a cover member 5 on the upper face of the reflecting member 10. The methods of disposition include drawing, transfer printing, and the like. This can more easily dispose the cover member 5 on the reflecting member 10 than in the case of employing a sheet-shaped cover member 5.

Step of Cutting

The step S207 of cutting workpiece is a step of cutting the collective body of light emitting devices 100A along the cutlines. The step S207 of cutting the workpiece can be performed in a similar manner to the cutting step S108 previously explained with reference to the method of manufacturing a light emitting device 100.

Third Embodiment

Light Emitting Device

Next, the light emitting device related to a third embodiment will be explained.

Figure 10A:
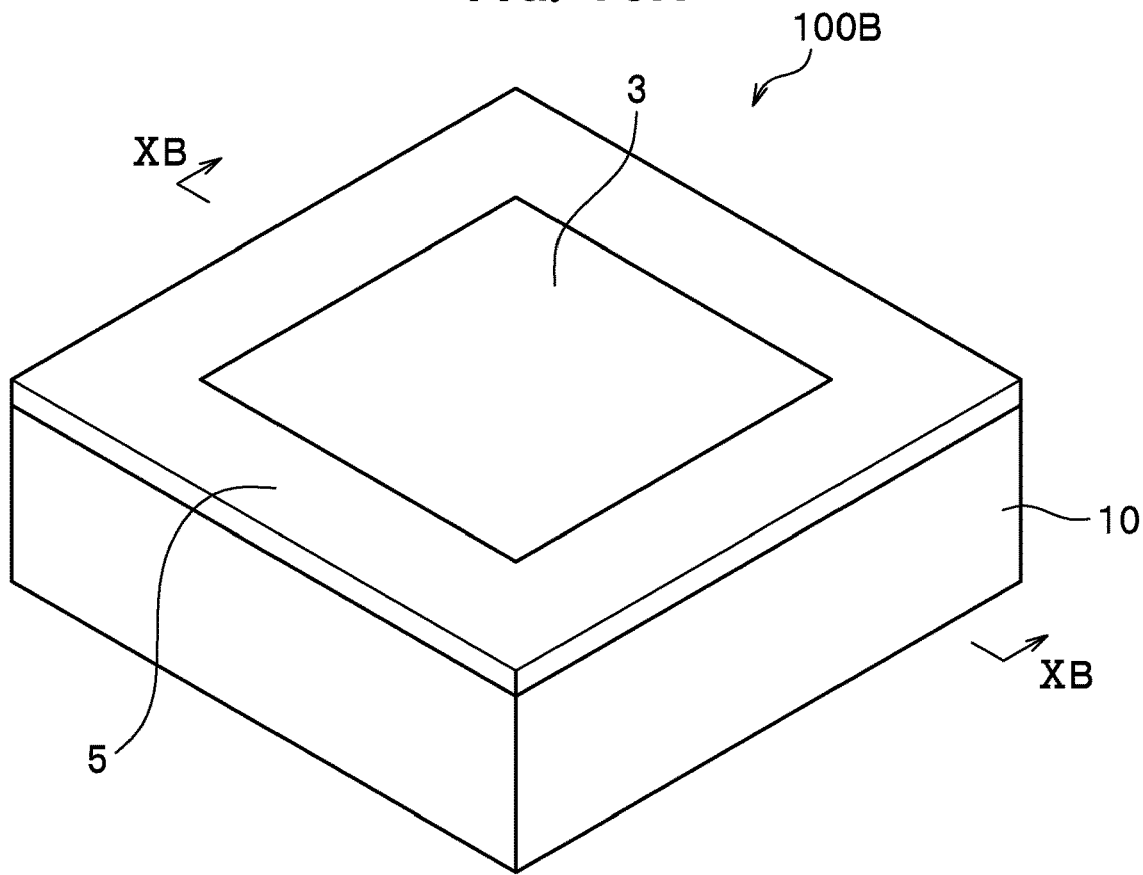
FIG. 10A is a perspective view schematically showing a structure of a light emitting device related to a third embodiment.
Figure 10B:
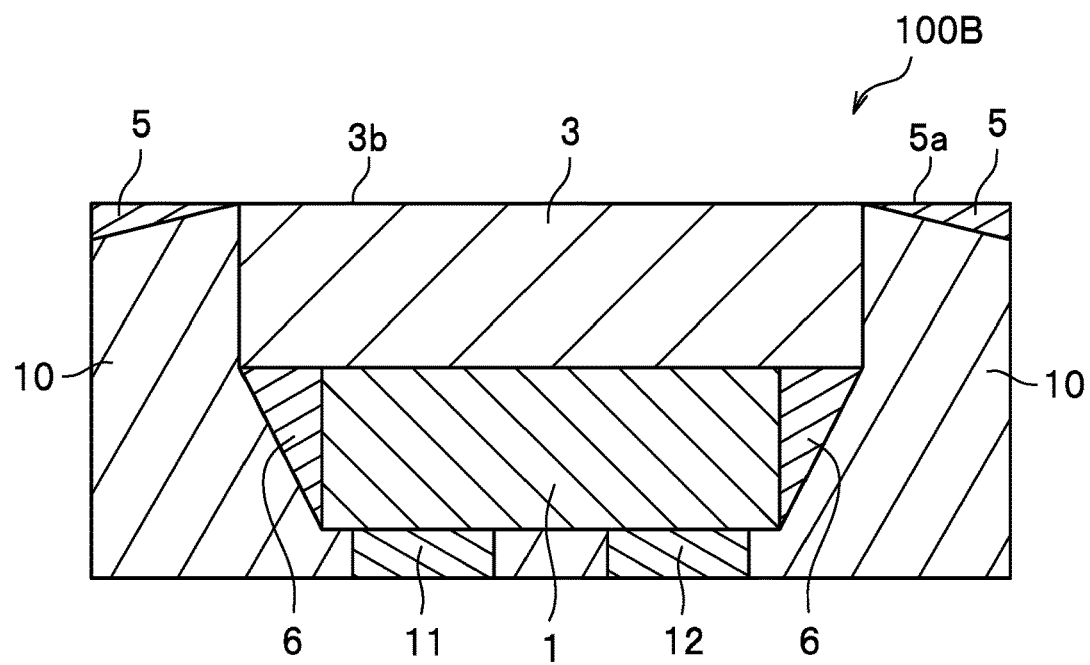
FIG. 10B is a cross-sectional view taken along line XB-XB in FIG. 10A.

As shown in FIG. 10A and FIG. 10B, the light emitting device 100B includes a light emitting element 1, a reflecting member 10, a wavelength conversion member 3, and a cover member 5. Moreover, the light emitting device 100B includes a light guide member 6 disposed on the lateral faces of the light emitting element 1.

Here, the differences from the first embodiment will primarily be explained.

In the light emitting device 100B, the upper face 5a of the cover member 5 is flush with the second face 3b of the wavelength conversion member 3. The reflecting member 10 covers from the upper edges to the lower edges of the outer faces of the wavelength conversion member 3. The cover member 5 is formed so that the thickness in the up and down direction in the vicinity of the wavelength conversion member 3 is smaller than the thickness in the up and down direction at the outer lateral faces of the light emitting device 100B. "The vicinity of the wavelength conversion member 3" in the present disclosure can be defined as the portion of the reflecting member 10 from the outer lateral faces of the wavelength conversion member 3 to one third of the distance between the outer lateral faces of the wavelength conversion member 3 and the outer lateral faces of the light emitting device 100B (i.e., the width of the reflecting member 10). In the present embodiment, the cover member 5 is formed so that the thickness in the up and down direction increases as it becomes more distant from the wavelength conversion member 3.

The cover member 5 is formed to have a frame shape to surround the wavelength conversion member 3. The cover member 5, as shown in FIG. 10B, is formed to have a triangular cross-sectional shape, i.e., the width of the member increases from the second face 3b of the wavelength conversion member 3 to the outer lateral faces of the light emitting device 100B. However, it is not intended to particularly restrict the shape of the cover member 5, and the cross-sectional shape can be any shape as long as the thickness increases from the inner side to the outer side, such as a trapezoid. The bottom face of the cover member 5 in contact with the reflecting member 10 is shown as a straight line in a cross section, but the bottom face in a cross section may form a curved line.

Method of Manufacturing Light Emitting Device

Next, one example of the method of manufacturing the light emitting device 100B related to the third embodiment will be explained with reference to FIG. 11 to FIG. 13B. In FIG. 12A to FIG. 13B, two light emitting devices 100B among multiple light emitting devices 100B simultaneously manufactured are schematically illustrated.

Figure 11:
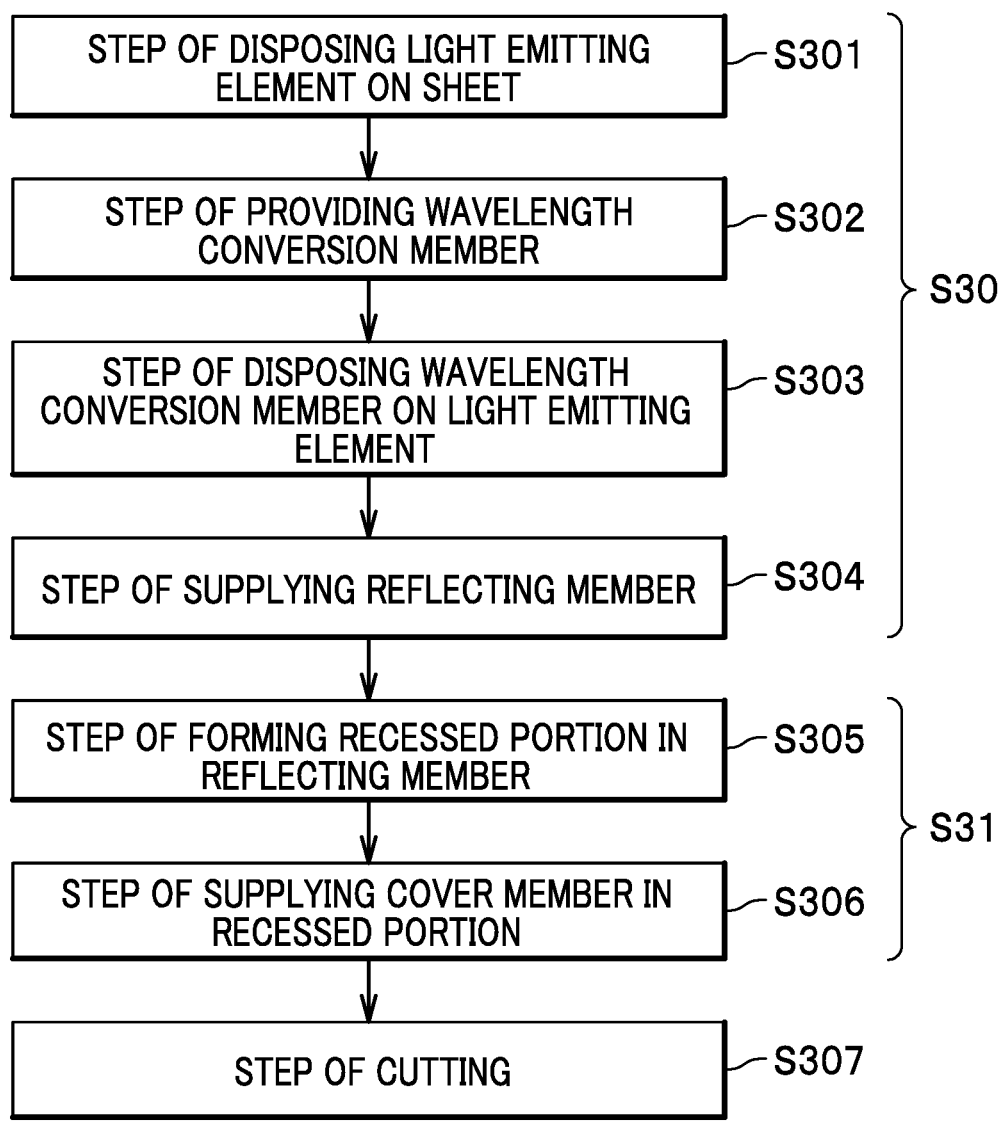
FIG. 11 is a flowchart for the method of manufacturing the light emitting device related to the third embodiment.

As shown in FIG. 11, the method of manufacturing the light emitting device 100B of the third embodiment includes a step S30 of providing a light emitting structure, a step S31 of disposing a cover member, and a step S307 of cutting a workpiece, which are performed in that order.

The materials and general layout of the members are as explained earlier with reference to the light emitting devices 100 and 100A, and thus the explanations here will be omitted when appropriate.

Step of Providing Light Emitting Structure

The step S30 of providing a light emitting structure is a step of providing a light emitting structure 31 (see FIG. 12C) which includes a light emitting element 1, a wavelength conversion member 3 disposed on the emission face 1a of the light emitting element 1, and a reflecting member 10 disposed on the lateral face sides of the light emitting element 1 and the lateral faces of the wavelength conversion member 3.

The step S30 of providing a light emitting structure includes a step S301 of disposing a light emitting element on a sheet, a step S302 of providing a wavelength conversion member, a step S303 of disposing the wavelength conversion member on the light emitting element, and a step S304 of supplying a reflecting member, which are performed in that order.

Step of Disposing Light Emitting Element on Sheet

Figure 12A:
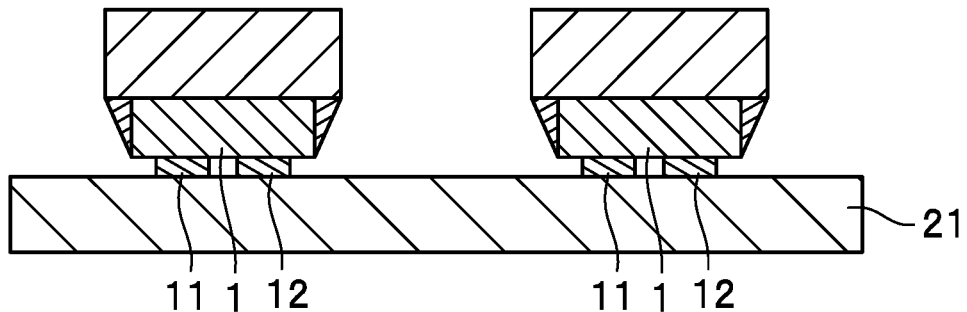
FIG. 12A is a cross-sectional view showing a step of disposing a wavelength conversion member on a light emitting element in the method of manufacturing the light emitting device related to the third embodiment.

The step S301 of disposing a light emitting element on a sheet is a step of disposing a light emitting element 1 on a sheet 21 so that the electrodes 11 and 12 face the sheet (see FIG. 12A).

Step of Providing Wavelength Conversion Member

The step S302 of providing a wavelength conversion member is a step of providing a wavelength conversion member 3 having a predetermined size. This can be accomplished, for example, by dividing a sheet-shaped wavelength conversion member 3 into individual pieces having a predetermined size. Examples of dividing methods include cutting by using a rotary blade, cutting by applying ultrasonic waves to a non-rotary blade, and the like.

Step of Disposing Wavelength Conversion Member on Light Emitting Element

The step S303 of disposing the wavelength conversion member on the light emitting element, as shown in FIG. 12A, is a step of disposing an individually divided wavelength conversion member 3 on the emission face 1a of each of the light emitting elements 1 via a bonding member. At this time, from the perspective of light distribution, the wavelength conversion member 3 and the light emitting element 1 are preferably bonded so that the center of the first face 3a of the wavelength conversion 3 coincides with the center of the emission face 1a of the light emitting element 1 when viewed from the top.

In the present embodiment, by adjusting the amount of the bonding member, the bonding member sags along the lateral faces of the light emitting element 1 to thereby form the bonding member on the lateral faces of the light emitting element 1.

A machining step of adjusting the outer shape of the wavelength conversion member 3 to a predetermined size may be added after disposing the light emitting element 1 on the wavelength conversion member 3.

Step of Supplying Reflecting Member

Figure 12B:
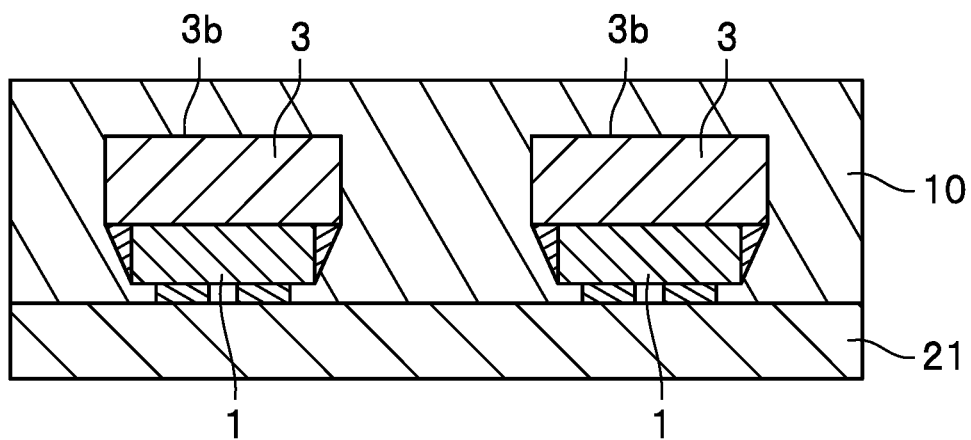
FIG. 12B is a cross-sectional view showing a step of supplying a reflecting member to cover the light emitting element, etc. in the method of manufacturing the light emitting device related to the third embodiment.

The step S304 of supplying a reflecting member, as shown in FIG. 12B, is a step of covering at least the light emitting element 1 and the wavelength conversion member 3 with a reflecting member 10 so that the reflecting member 10 is positioned higher above the second face 3b of the wavelength conversion member 3. The step S304 can be performed in a similar manner to the step S203 of supplying a reflecting member described earlier with reference to the method of manufacturing the light emitting device 100A.

Step of Disposing Cover Member

The step S31 of disposing a cover member is a step of disposing a cover member 5, which contains at least one of a pigment and dye, on the reflecting member 10 at the peripheral ends of the wavelength conversion member 3.

The step S31 of disposing a cover member includes a step S305 of forming a recessed portion in the reflecting member and a step S306 of supplying a cover member in the recessed portion, which are performed in that order.

Step of Forming Recess

Figure 12C:
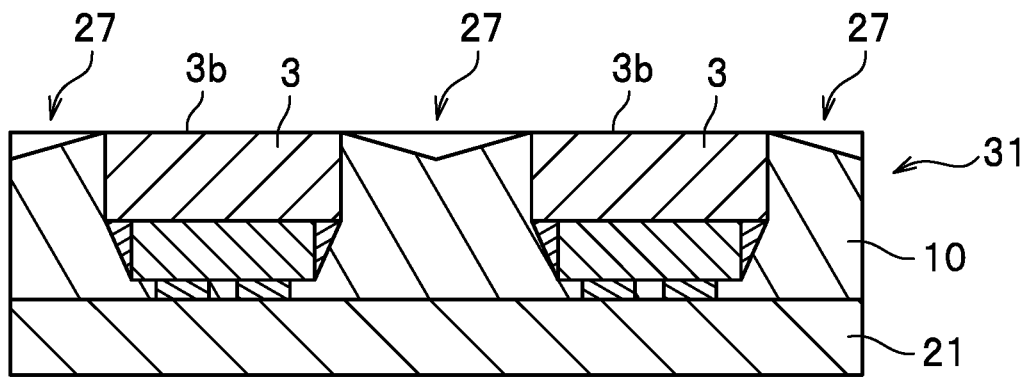
FIG. 12C is a cross-sectional view showing a step of forming recessed portions in the reflecting member in the method of manufacturing the light emitting device related to the third embodiment.

The step S305 of forming a recessed portion, as shown in FIG. 12C, is a step of removing a portion of the reflecting member 10 so as to expose the second face 3b of the wavelength conversion member 3 and forming a recessed portion 27 at the location of the reflecting member 10 where a cover member 5 is to be disposed.

The partial removal of the reflecting member 10 can be accomplished by polishing or grinding. From the perspective of easily forming a recessed portion 27, the reflecting member 10 is preferably removed by a blasting process.

In the case of removing the reflecting member 10 by blasting, the hardness of the reflecting member 10 is preferably lower than the hardness of the wavelength conversion member 3. In this manner, after removing the reflecting member 10 until the second face 3b of the wavelength conversion member 3 is exposed, the blasting process can be continued to further remove the reflecting member 10 to thereby remove a portion of the reflecting member 10 located sideways. As a result, a recessed portion 27 is formed on the upper face of the reflecting member 10.

Step of Supplying Cover Memberin Recessed Portion

The step S306 of supplying a cover member in the recessed portion, as shown in FIG. 13A, is a step of supplying a cover member 5 in the recessed portion 27 to thereby dispose the cover member 5 on the reflecting member 10.

In the step S306, the cover member 5 can be disposed in the recessed portion 27 using a liquid material to-be the cover member by potting. Potting can be performed by using a dispenser. More specifically, the cover member 5 can be disposed by using a dispenser to draw a resin or the like to-be the cover member 5 onto the recessed portion 27.

Step of Cutting

The step S307 of cutting a workpiece, as shown in FIG. 13B, is a step of cutting a collective body of light emitting devices 100B at the cutlines.

In the step S307, a cutline is defined in the center of the recessed portion 27 between two light emitting devices 100B, and the workpiece is vertically cut along the cutline. The step S307 of cutting the workpiece can be performed in a similar manner to the step S108 of cutting the workpiece described earlier with reference to the method of manufacturing the light emitting device 100.

The sheet 21 is removed before or after cutting the workpiece. Alternatively, the sheet 21 may be removed before forming the recessed portion 27.

The light emitting devices and the methods of manufacturing the light emitting devices related to certain embodiments have been specifically explained above. However, the present invention is not limited to those described above, and must be broadly interpreted based on the scope of the claims herein. Various modifications and changes made based on the above descriptions are encompassed by the spirit and scope of the present invention.

Other embodiments will be explained below.

Figure 14A:
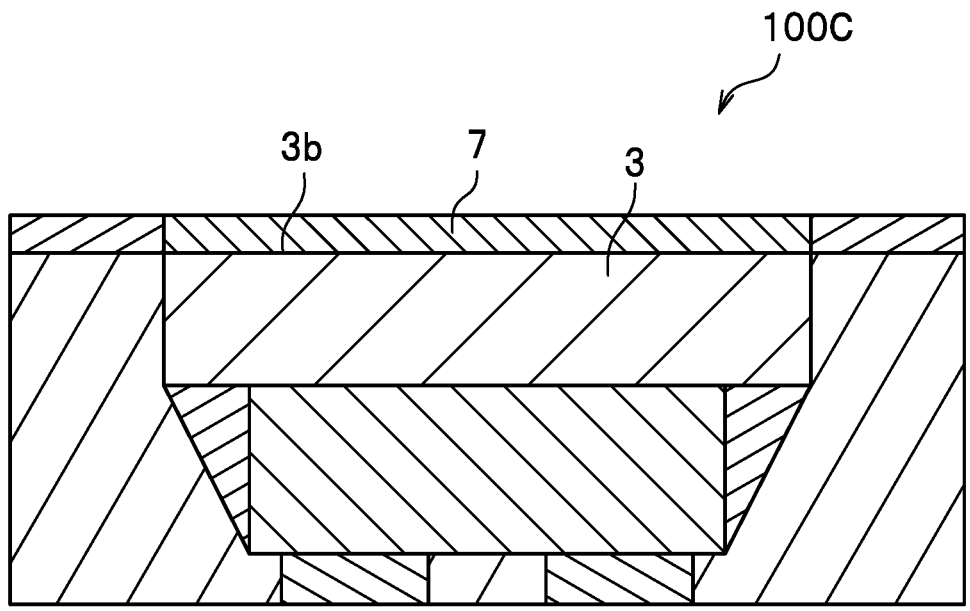
FIG. 14A is a cross-sectional view schematically showing a structure of a light emitting device related to another embodiment.

The wavelength conversion member 3 can be of a multilayer structure besides a single layer structure. The wavelength conversion member 3 may be one formed by stacking a plurality of wavelength conversion members each containing a different wavelength conversion substance. The wavelength conversion member 3 may include a light transmissive layer containing substantially no wavelength conversion substance. A light transmissive member, such as a light transmissive layer containing substantially no wavelength conversion substance, a layer containing a diffusing agent, a layer whose surface has a depression or protrusion, a convex lens, or the like, may be stacked on the wavelength conversion member 3. FIG. 14A shows the structure in which a light transmissive layer 7 is stacked on the wavelength conversion member 3. Stacking of a light transmissive layer 7 can protect the wavelength conversion substance against the external environment.

In the case where the wavelength conversion member 3 is a stack in which a light transmissive layer 7 containing substantially no wavelength conversion substance is included, it is preferable to dispose the light transmissive layer 7 on the second face 3b of the wavelength conversion member 3 as shown in FIG. 14A. In this case, the light transmissive layer 7 may be formed as a part of the wavelength conversion member 3, but can be formed as a layer containing substantially no wavelength conversion substance that is different from the wavelength conversion member 3 containing a wavelength conversion substance.

Disposing the light transmissive layer 7 on the second face 3b of the wavelength conversion member 3 allows the light transmissive layer 7 to serve as a protective layer when the light emitting device 100C is completed, to thereby protect the wavelength conversion substance against the external environment.

As in the case of the light emitting device 100C shown in FIG. 14A, the light emitting device 100A (see FIG. 6B) may also be provided with a light transmissive layer 7 on the second face 3b of the wavelength conversion member 3. This can protect the wavelength conversion substance against the external environment.

The light transmissive layer 7 is a transparent material, and examples of materials for the light transmissive layer 7 include light transmissive resins, ceramics, glass, and the like, that can be used as the wavelength conversion member 3.

The light transmissive layer 7 can be formed by disposing a light transmissive layer 7 in the through hole 26 of the sheet-shaped cover member 5 (i.e., frame 25) in the step S205 of providing a sheet-shaped cover member in the method of manufacturing a light emitting device 100A related to the second embodiment. The light transmissive layer 7 can alternatively be formed by disposing a light transmissive layer 7 in the through hole 26 of the frame 25 after adhering the frame 25 and the light emitting structure 30.

The light emitting device 100B is explained such that the reflecting member 10 covers from the upper edges to the lower edges of the outer lateral faces of the wavelength conversion member 3. However, the cover member 5 may cover some portions of the outer lateral faces of the wavelength conversion member 3 on the upper end side.

Figure 14B:
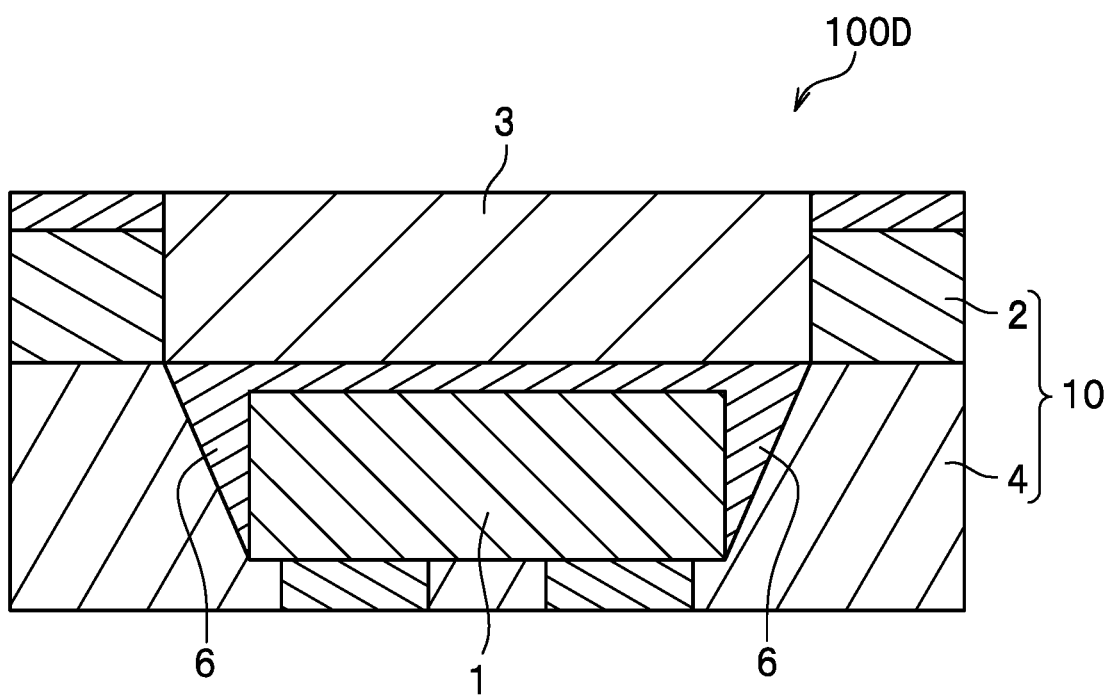
FIG. 14B is a cross-sectional view schematically showing a structure of a light emitting device related to another embodiment.

Furthermore, the light guide member 6 does not have to be provided. Alternatively, the light guide member 6 may be disposed not only on the lateral faces of the light emitting element 1, but also between the light emitting element 1 and the wavelength conversion member 3 as shown in FIG. 14B. In this case, from the perspective of more firmly bonding the light emitting element 1 and the wavelength conversion member 3, as well as from the perspective of increasing luminous flux and light extraction efficiency, the thickness of the light guide member 6 in the up and down direction is preferably in a range from 0.5 µm to 20 µm, more preferably in a range from 0.5 µm to 10 µm. A single or multiple light emitting elements 1 may be provided per device. For example, the light emitting device may have two light emitting elements 1 as shown in FIG. 13A. In the case of a light emitting device in which two light emitting elements 1 are installed, for example, the adjacent light guide members 6 positioned between the two light emitting elements 1 may be connected as one body. The light emitting device may include a mounting substrate for mounting the light emitting device 100.

In the methods of manufacturing the light emitting devices, the order of steps may be switched to the extent possible. Moreover, an additional step may be included between steps, before or after any step to the extent that such an additional step does not have any adverse effect on the steps. For example, a step of removing foreign matter, or the like, may be included to remove foreign matter that might get mixed in during manufacturing.

The light emitting devices related to the embodiments of the present disclosure can be utilized in various types of lighting devices, such as camera flashlights, lighting fixtures, and the like.

What is claimed is:

1. A light emitting device comprising:
    a light emitting element having an emission face and lateral faces;
    a wavelength conversion member having a first face and a second face which opposes the first face, the wavelength conversion member being disposed on the emission face of the light emitting element so that the first face faces the emission face;
    a reflecting member disposed on lateral face sides of the light emitting element and covering at least a portion of outer lateral faces of the wavelength conversion member, and
    a cover member disposed on an upper face of the reflecting member while being adjacent to peripheral ends of the wavelength conversion member, wherein
    the cover member contains at least one of a reflecting substance and a coloring substance, and
    a body color of the wavelength conversion member and a body color of the cover member are the same color or similar colors.

2. The light emitting device according to claim 1, wherein the cover member has a thickness smaller than a thickness of the wavelength conversion member, the cover member thickness being constant in the thickness.

3. The light emitting device according to claim 1, wherein the upper face of the reflecting member is flush with the second face of the wavelength conversion member.

4. The light emitting device according to claim 3 further comprising a light transmissive layer on the second face of the wavelength conversion member.

5. The light emitting device according to claim 1, wherein
    an upper face of the cover member is flush with the second face of the wavelength conversion member, and
    the reflecting member covers from upper edges to lower edges of the outer lateral faces of the wavelength conversion member.

6. The light emitting device according to claim 1, wherein a thickness of the cover member in a vicinity of the wavelength conversion member is smaller than a thickness of the cover member at outer lateral faces of the light emitting device.

7. The light emitting device according to claim 1, wherein the reflecting member is disposed on the lateral faces of the light emitting element via a light guide member.

8. A method of manufacturing a light emitting device comprising:
    providing a sheet-shaped member, which has a stack of a first reflecting member and a cover member containing at least one of a pigment and a dye, and a wavelength conversion member disposed in a through hole of the stack;
    disposing a light emitting element so that an emission face of the light emitting element faces a first face of the wavelength conversion member, the wavelength conversion member being surrounded by a first reflecting member, and
    supplying a second reflecting member to cover lateral face sides of the light emitting element,
    wherein the step of providing a sheet-shaped member includes providing the stack by
    adhering the first reflecting member having a sheet shape and the cover member having a sheet shape.

9. The method of manufacturing a light emitting device according to claim 8, wherein the step of providing a sheet-shaped member includes creating the through hole in the stack and supplying the wavelength conversion member in the through hole.

10. The method of manufacturing a light emitting device according to claim 9, wherein
the step of supplying a wavelength conversion member in the through hole includes
providing the wavelength conversion member which contains a wavelength conversion substance and a resin, and
localizing the wavelength conversion substance on or near a face of the wavelength conversion member on the cover member side or a face of the wavelength conversion member on an outer surface side of the first reflecting member after supplying the wavelength conversion member in the through hole.

11. A method of manufacturing a light emitting device comprising:
providing a sheet-shaped member, which has a stack of a first reflecting member and a cover member containing at least one of a pigment and a dye, and a wavelength conversion member disposed in a through hole of the stack;
disposing a light emitting element so that an emission face of the light emitting element faces a first face of the wavelength conversion member, the wavelength conversion member being surrounded by a first reflecting member, and
supplying a second reflecting member to cover lateral face sides of the light emitting element,
wherein the step of providing a sheet-shaped member includes providing the stack by disposing the cover member on an upper face of the first reflecting member having a sheet shape by printing or spraying.

12. A method of manufacturing a light emitting device comprising:
providing a light emitting structure which includes a light emitting element, a wavelength conversion member disposed on an emission face of the light emitting element, and a reflecting member disposed on lateral faces of the light emitting element and on lateral faces of the wavelength conversion member, and
disposing a cover member, which contains at least one of a pigment and dye, on the reflecting member at peripheral ends of the wavelength conversion member.

13. The method of manufacturing a light emitting device according to claim 12, wherein the step of disposing a cover member includes forming a recessed portion in the reflecting member, and supplying the cover member in the recessed portion.

14. The method of manufacturing a light emitting device according to claim 12, wherein the step of disposing a cover member includes supplying the cover member in a liquid form by potting, or adhering the cover member having a sheet shape.

15. The method of manufacturing a light emitting device according to claim 13, wherein the step of disposing a cover member includes supplying the cover member in a liquid form by potting, or adhering the cover member having a sheet shape.

* * * * *